(12) United States Patent
Kothari et al.

(10) Patent No.: US 8,270,062 B2
(45) Date of Patent: Sep. 18, 2012

(54) DISPLAY DEVICE WITH AT LEAST ONE MOVABLE STOP ELEMENT

(75) Inventors: Manish Kothari, Cupertino, CA (US); Sauri Gudlavalleti, Machilipatnam (IN); Stephen Zee, San Jose, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 337 days.

(21) Appl. No.: 12/562,093

(22) Filed: Sep. 17, 2009

(65) Prior Publication Data

US 2011/0063712 A1 Mar. 17, 2011

(51) Int. Cl.
*G02B 26/00* (2006.01)

(52) U.S. Cl. .................. 359/290; 359/291; 359/292

(58) Field of Classification Search ........... 359/290–292
See application file for complete search history.

(56) References Cited

U.S. PATENT DOCUMENTS

| | | |
|---|---|---|
| 2,590,906 A | 4/1952 | Tripp |
| 2,677,714 A | 5/1954 | Auwarter |
| 3,247,392 A | 4/1966 | Thelen |
| 3,679,313 A | 7/1972 | Rosenberg |
| 3,728,030 A | 4/1973 | Hawes |
| 3,886,310 A | 5/1975 | Guldberg |
| 3,955,190 A | 5/1976 | Teraishi |
| 4,403,248 A | 9/1983 | te Velde |
| 4,421,381 A | 12/1983 | Ueda et al. |
| 4,441,789 A | 4/1984 | Pohlack |
| 4,441,791 A | 4/1984 | Hornbeck |
| 4,497,974 A | 2/1985 | Deckman et al. |
| 4,498,953 A | 2/1985 | Cook et al. |
| 4,560,435 A | 12/1985 | Brown et al. |
| 4,655,554 A | 4/1987 | Armitage |
| 4,705,361 A | 11/1987 | Frazier et al. |
| 4,779,959 A | 10/1988 | Saunders |
| 4,786,128 A | 11/1988 | Birnbach |
| 4,822,993 A | 4/1989 | Dillon et al. |
| 4,859,060 A | 8/1989 | Katagiri et al. |
| 4,925,259 A | 5/1990 | Emmett |
| 4,954,789 A | 9/1990 | Sampsell |
| 4,956,619 A | 9/1990 | Hornbeck |

(Continued)

FOREIGN PATENT DOCUMENTS

DE 10 2006 039 071 2/2008

(Continued)

OTHER PUBLICATIONS

Conner, "Hybrid Color Display Using Optical Interference Filter Array," SID Digest, pp. 577-580, (1993).

(Continued)

*Primary Examiner* — Ricky Mack
*Assistant Examiner* — Mahidere Sahle
(74) *Attorney, Agent, or Firm* — Knobbe, Martens, Olson & Bear, LLP

(57) ABSTRACT

In certain embodiments, a device is provided including a substrate and a plurality of supports over the substrate. The device may further include a mechanical layer having a movable portion and a stationary portion. The stationary portion may disposed over the supports. In certain embodiments, the device further includes a reflective surface positioned over the substrate and mechanically coupled to the movable portion. The device of certain embodiments further includes at least one movable stop element displaced from and mechanically coupled to the movable portion. In certain embodiments, the at least a portion of the stop element may be positioned over the stationary portion.

31 Claims, 22 Drawing Sheets

U.S. PATENT DOCUMENTS

| | | | |
|---|---|---|---|
| 4,973,131 A | 11/1990 | Carnes |
| 4,982,184 A | 1/1991 | Kirkwood |
| 5,022,745 A | 6/1991 | Zayhowski et al. |
| 5,028,939 A | 7/1991 | Hornbeck et al. |
| 5,062,689 A | 11/1991 | Koehler |
| 5,091,983 A | 2/1992 | Lukosz |
| 5,096,279 A | 3/1992 | Hornbeck et al. |
| 5,170,283 A | 12/1992 | O'Brien et al. |
| 5,315,370 A | 5/1994 | Bulow |
| 5,381,232 A | 1/1995 | Van Wijk |
| 5,452,138 A | 9/1995 | Mignardi et al. |
| 5,471,341 A | 11/1995 | Warde et al. |
| 5,526,172 A | 6/1996 | Kanack |
| 5,550,373 A | 8/1996 | Cole et al. |
| 5,559,358 A | 9/1996 | Burns et al. |
| 5,561,523 A | 10/1996 | Blomberg et al. |
| 5,597,736 A | 1/1997 | Sampsell |
| 5,600,383 A | 2/1997 | Hornbeck |
| 5,636,052 A | 6/1997 | Arney et al. |
| 5,646,729 A | 7/1997 | Koskinen et al. |
| 5,646,768 A | 7/1997 | Kaeiyama |
| 5,661,592 A | 8/1997 | Bornstein et al. |
| 5,665,997 A | 9/1997 | Weaver et al. |
| 5,699,181 A | 12/1997 | Choi |
| 5,710,656 A | 1/1998 | Goosen |
| 5,719,068 A | 2/1998 | Suzawa et al. |
| 5,734,177 A | 3/1998 | Sakamoto |
| 5,771,116 A | 6/1998 | Miller et al. |
| 5,786,927 A | 7/1998 | Greywall et al. |
| 5,808,781 A | 9/1998 | Arney et al. |
| 5,818,095 A | 10/1998 | Sampsell |
| 5,825,528 A | 10/1998 | Goosen |
| 5,838,484 A | 11/1998 | Goossen et al. |
| 5,867,302 A | 2/1999 | Fleming |
| 5,870,221 A | 2/1999 | Goossen |
| 5,914,804 A | 6/1999 | Goossen |
| 5,920,418 A | 7/1999 | Shiono et al. |
| 5,961,848 A | 10/1999 | Jacquet et al. |
| 6,028,689 A | 2/2000 | Michalicek et al. |
| 6,031,653 A | 2/2000 | Wang |
| 6,040,937 A | 3/2000 | Miles |
| 6,046,659 A | 4/2000 | Loo et al. |
| 6,055,090 A | 4/2000 | Miles |
| 6,100,861 A | 8/2000 | Cohen et al. |
| 6,124,851 A | 9/2000 | Jacobsen |
| 6,242,932 B1 | 6/2001 | Hembree |
| 6,262,697 B1 | 7/2001 | Stephenson |
| 6,301,000 B1 | 10/2001 | Johnson |
| 6,323,987 B1 | 11/2001 | Rinaudo et al. |
| 6,327,071 B1 | 12/2001 | Kimura |
| 6,335,235 B1 | 1/2002 | Bhekta et al. |
| 6,351,329 B1 | 2/2002 | Greywall |
| 6,356,378 B1 | 3/2002 | Huibers |
| 6,377,233 B2 | 4/2002 | Colgan et al. |
| 6,381,022 B1 | 4/2002 | Zavracky |
| 6,384,952 B1 | 5/2002 | Clark et al. |
| 6,400,738 B1 | 6/2002 | Tucker et al. |
| 6,433,917 B1 | 8/2002 | Mei et al. |
| 6,437,583 B1 | 8/2002 | Tartagni et al. |
| 6,438,282 B1 | 8/2002 | Takeda et al. |
| 6,452,712 B2 | 9/2002 | Atobe et al. |
| 6,466,354 B1 | 10/2002 | Gudeman |
| 6,519,073 B1 | 2/2003 | Goossen |
| 6,556,338 B2 | 4/2003 | Han et al. |
| 6,574,033 B1 | 6/2003 | Chui et al. |
| 6,597,490 B2 | 7/2003 | Tayebati |
| 6,608,268 B1 | 8/2003 | Goldsmith |
| 6,632,698 B2 | 10/2003 | Ives |
| 6,650,455 B2 | 11/2003 | Miles |
| 6,657,832 B2 | 12/2003 | Williams et al. |
| 6,661,561 B2 | 12/2003 | Fitzpatrick et al. |
| 6,674,562 B1 | 1/2004 | Miles et al. |
| 6,680,792 B2 | 1/2004 | Miles |
| 6,698,295 B1 | 3/2004 | Sherrer |
| 6,710,908 B2 | 3/2004 | Miles et al. |
| 6,738,194 B1 | 5/2004 | Ramirez et al. |
| 6,768,555 B2 | 7/2004 | Chen |
| 6,794,119 B2 | 9/2004 | Miles |
| 6,813,059 B2 | 11/2004 | Hunter et al. |
| 6,836,366 B1 | 12/2004 | Flanders et al. |
| 6,841,081 B2 | 1/2005 | Chang et al. |
| 6,844,959 B2 | 1/2005 | Huibers et al. |
| 6,849,471 B2 | 2/2005 | Patel et al. |
| 6,862,127 B1 | 3/2005 | Ishii |
| 6,867,896 B2 | 3/2005 | Miles |
| 6,870,654 B2 | 3/2005 | Lin et al. |
| 6,882,458 B2 | 4/2005 | Lin et al. |
| 6,882,461 B1 | 4/2005 | Tsai et al. |
| 6,912,022 B2 | 6/2005 | Lin et al. |
| 6,913,942 B2 | 7/2005 | Patel et al. |
| 6,940,630 B2 | 9/2005 | Xie |
| 6,947,200 B2 | 9/2005 | Huibers |
| 6,952,303 B2 | 10/2005 | Lin et al. |
| 6,958,847 B2 | 10/2005 | Lin |
| 6,960,305 B2 | 11/2005 | Doan et al. |
| 6,980,350 B2 | 12/2005 | Hung et al. |
| 6,982,820 B2 | 1/2006 | Tsai |
| 7,002,726 B2 | 2/2006 | Patel et al. |
| 7,006,272 B2 | 2/2006 | Tsai |
| 7,009,754 B2 | 3/2006 | Huibers |
| 7,027,204 B2 | 4/2006 | Trisnadi et al. |
| 7,034,981 B2 | 4/2006 | Makigaki |
| 7,046,422 B2 | 5/2006 | Kimura et al. |
| 7,072,093 B2 | 7/2006 | Piehl et al. |
| 7,113,339 B2 | 9/2006 | Taguchi et al. |
| 7,119,945 B2 | 10/2006 | Kothari et al. |
| 7,123,216 B1 | 10/2006 | Miles |
| 7,126,738 B2 | 10/2006 | Miles |
| 7,130,104 B2 | 10/2006 | Cummings |
| 7,184,195 B2 | 2/2007 | Yang |
| 7,184,202 B2 | 2/2007 | Miles et al. |
| 7,198,973 B2 | 4/2007 | Lin et al. |
| 7,221,495 B2 | 5/2007 | Miles et al. |
| 7,236,284 B2 | 6/2007 | Miles |
| 7,245,285 B2 | 7/2007 | Yeh et al. |
| 7,289,259 B2 | 10/2007 | Chui et al. |
| 7,302,157 B2 | 11/2007 | Chui |
| 7,321,456 B2 | 1/2008 | Cummings |
| 7,321,457 B2 | 1/2008 | Heald |
| 7,327,510 B2 | 2/2008 | Cummings et al. |
| 7,372,613 B2 | 5/2008 | Chui et al. |
| 7,372,619 B2 | 5/2008 | Miles |
| 7,385,744 B2 | 6/2008 | Kogut et al. |
| 7,385,762 B2 | 6/2008 | Cummings |
| 7,400,488 B2 | 7/2008 | Lynch et al. |
| 7,405,852 B2 | 7/2008 | Brosnihan et al. |
| 7,417,746 B2 | 8/2008 | Lin et al. |
| 7,420,725 B2 | 9/2008 | Kothari |
| 7,436,573 B2 | 10/2008 | Doan et al. |
| 7,459,402 B2 | 12/2008 | Doan et al. |
| 7,460,291 B2 | 12/2008 | Sampsell et al. |
| 7,460,292 B2 | 12/2008 | Chou |
| 7,476,327 B2 | 1/2009 | Tung et al. |
| 7,477,440 B1 | 1/2009 | Huang et al. |
| 7,492,503 B2 | 2/2009 | Chui |
| 7,508,566 B2 | 3/2009 | Feenstra et al. |
| 7,527,995 B2 | 5/2009 | Sampsell |
| 7,532,377 B2 | 5/2009 | Miles |
| 7,532,386 B2 | 5/2009 | Cummings |
| 7,535,621 B2 | 5/2009 | Chiang |
| 7,542,198 B2 | 6/2009 | Kothari |
| 7,550,810 B2 | 6/2009 | Mignard et al. |
| 7,554,711 B2 | 6/2009 | Miles |
| 7,554,714 B2 | 6/2009 | Chui et al. |
| 7,561,321 B2 | 7/2009 | Heald |
| 7,564,612 B2 | 7/2009 | Chui |
| 7,566,664 B2 | 7/2009 | Yan et al. |
| 7,567,373 B2 | 7/2009 | Chui et al. |
| 7,569,488 B2 | 8/2009 | Rafanan |
| 7,612,932 B2 | 11/2009 | Chui et al. |
| 7,612,933 B2 | 11/2009 | Djordjev |
| 7,629,197 B2 | 12/2009 | Luo et al. |
| 7,630,119 B2 | 12/2009 | Tung et al. |
| 7,630,121 B2 | 12/2009 | Endisch et al. |
| 7,782,523 B2 | 8/2010 | Ishii |
| 7,813,029 B2 | 10/2010 | Kothari et al. |
| 7,848,003 B2 | 12/2010 | Kothari et al. |

| | | |
|---|---|---|
| 7,852,544 B2 | 12/2010 | Sampsell |
| 7,855,826 B2 | 12/2010 | de Groot |
| 7,898,722 B2 | 3/2011 | Miles |
| 2001/0003487 A1 | 6/2001 | Miles |
| 2001/0028503 A1 | 10/2001 | Flanders et al. |
| 2001/0043171 A1 | 11/2001 | Van Gorkom et al. |
| 2002/0054424 A1 | 5/2002 | Miles |
| 2002/0070931 A1 | 6/2002 | Ishikawa |
| 2002/0075555 A1 | 6/2002 | Miles |
| 2002/0126364 A1 | 9/2002 | Miles |
| 2002/0146200 A1 | 10/2002 | Kudrle et al. |
| 2002/0149828 A1 | 10/2002 | Miles |
| 2002/0149834 A1 | 10/2002 | Mei et al. |
| 2002/0154422 A1 | 10/2002 | Sniegowski et al. |
| 2002/0197761 A1 | 12/2002 | Patel et al. |
| 2003/0011864 A1 | 1/2003 | Flanders |
| 2003/0016428 A1 | 1/2003 | Kato et al. |
| 2003/0035196 A1 | 2/2003 | Walker |
| 2003/0043157 A1 | 3/2003 | Miles |
| 2003/0053078 A1 | 3/2003 | Missey et al. |
| 2003/0119221 A1 | 6/2003 | Cunningham et al. |
| 2003/0123125 A1 | 7/2003 | Little |
| 2003/0138669 A1 | 7/2003 | Kojima et al. |
| 2003/0173504 A1 | 9/2003 | Cole et al. |
| 2003/0202265 A1 | 10/2003 | Reboa et al. |
| 2003/0202266 A1 | 10/2003 | Ring et al. |
| 2004/0008396 A1 | 1/2004 | Stappaerts |
| 2004/0008438 A1 | 1/2004 | Sato |
| 2004/0027671 A1 | 2/2004 | Wu et al. |
| 2004/0027701 A1 | 2/2004 | Ishikawa |
| 2004/0043552 A1 | 3/2004 | Strumpell et al. |
| 2004/0058532 A1 | 3/2004 | Miles et al. |
| 2004/0066477 A1 | 4/2004 | Morimoto et al. |
| 2004/0075967 A1 | 4/2004 | Lynch et al. |
| 2004/0076802 A1 | 4/2004 | Tompkin et al. |
| 2004/0080035 A1 | 4/2004 | Delapierre |
| 2004/0100594 A1 | 5/2004 | Huibers et al. |
| 2004/0100677 A1 | 5/2004 | Huibers et al. |
| 2004/0125281 A1 | 7/2004 | Lin et al. |
| 2004/0125282 A1 | 7/2004 | Lin et al. |
| 2004/0145811 A1 | 7/2004 | Lin et al. |
| 2004/0147198 A1 | 7/2004 | Lin et al. |
| 2004/0175577 A1 | 9/2004 | Lin et al. |
| 2004/0184134 A1 | 9/2004 | Makigaki |
| 2004/0188599 A1 | 9/2004 | Viktorovitch et al. |
| 2004/0207897 A1 | 10/2004 | Lin |
| 2004/0209195 A1 | 10/2004 | Lin |
| 2004/0217264 A1 | 11/2004 | Wood et al. |
| 2004/0217919 A1 | 11/2004 | Pichi et al. |
| 2004/0218251 A1 | 11/2004 | Piehl et al. |
| 2004/0240032 A1 | 12/2004 | Miles |
| 2004/0259010 A1 | 12/2004 | Kanbe |
| 2005/0002082 A1 | 1/2005 | Miles |
| 2005/0003667 A1 | 1/2005 | Lin et al. |
| 2005/0024557 A1 | 2/2005 | Lin |
| 2005/0035699 A1 | 2/2005 | Tsai |
| 2005/0036095 A1 | 2/2005 | Yeh et al. |
| 2005/0046919 A1 | 3/2005 | Taguchi et al. |
| 2005/0046922 A1 | 3/2005 | Lin et al. |
| 2005/0046948 A1 | 3/2005 | Lin |
| 2005/0068627 A1 | 3/2005 | Nakamura et al. |
| 2005/0078348 A1 | 4/2005 | Lin |
| 2005/0117190 A1 | 6/2005 | Iwauchi et al. |
| 2005/0117623 A1 | 6/2005 | Shchukin et al. |
| 2005/0128543 A1 | 6/2005 | Phillips et al. |
| 2005/0133761 A1 | 6/2005 | Thielemans |
| 2005/0168849 A1 | 8/2005 | Lin |
| 2005/0179378 A1 | 8/2005 | Oooka et al. |
| 2005/0195462 A1 | 9/2005 | Lin |
| 2005/0275930 A1 | 12/2005 | Patel et al. |
| 2006/0007517 A1 | 1/2006 | Tsai |
| 2006/0017379 A1 | 1/2006 | Su et al. |
| 2006/0017689 A1 | 1/2006 | Faase et al. |
| 2006/0024880 A1 | 2/2006 | Chui et al. |
| 2006/0038643 A1 | 2/2006 | Xu et al. |
| 2006/0065940 A1 | 3/2006 | Kothari |
| 2006/0066599 A1 | 3/2006 | Chui |
| 2006/0066640 A1 | 3/2006 | Kothari et al. |
| 2006/0066641 A1 | 3/2006 | Gally et al. |
| 2006/0066938 A1 | 3/2006 | Chui et al. |
| 2006/0077155 A1 | 4/2006 | Chui et al. |
| 2006/0077156 A1 | 4/2006 | Chui et al. |
| 2006/0082588 A1 | 4/2006 | Mizuno et al. |
| 2006/0082863 A1 | 4/2006 | Piehl et al. |
| 2006/0132927 A1 | 6/2006 | Yoon |
| 2006/0180886 A1 | 8/2006 | Tsang |
| 2006/0220160 A1 | 10/2006 | Miles |
| 2006/0262126 A1 | 11/2006 | Miles |
| 2007/0020948 A1 | 1/2007 | Piehl et al. |
| 2007/0077525 A1 | 4/2007 | Davis et al. |
| 2007/0086078 A1 | 4/2007 | Hagood et al. |
| 2007/0097694 A1 | 5/2007 | Faase et al. |
| 2007/0121118 A1 | 5/2007 | Gally et al. |
| 2007/0153860 A1 | 7/2007 | Chang-Hasnain et al. |
| 2007/0177247 A1 | 8/2007 | Miles |
| 2007/0216987 A1 | 9/2007 | Hagood et al. |
| 2007/0253054 A1 | 11/2007 | Miles |
| 2007/0279729 A1 | 12/2007 | Kothari et al. |
| 2007/0279730 A1 | 12/2007 | Heald |
| 2007/0285761 A1 | 12/2007 | Zhong et al. |
| 2008/0002299 A1 | 1/2008 | Thurn |
| 2008/0013145 A1 | 1/2008 | Chui et al. |
| 2008/0030657 A1 | 2/2008 | Wu et al. |
| 2008/0037093 A1 | 2/2008 | Miles |
| 2008/0055706 A1 | 3/2008 | Chui et al. |
| 2008/0055707 A1 | 3/2008 | Kogut et al. |
| 2008/0068697 A1 | 3/2008 | Haluzak et al. |
| 2008/0080043 A1 | 4/2008 | Chui et al. |
| 2008/0088904 A1 | 4/2008 | Miles |
| 2008/0088910 A1 | 4/2008 | Miles |
| 2008/0088911 A1 | 4/2008 | Miles |
| 2008/0088912 A1 | 4/2008 | Miles |
| 2008/0094690 A1 | 4/2008 | Luo et al. |
| 2008/0106782 A1 | 5/2008 | Miles |
| 2008/0110855 A1 | 5/2008 | Cummings |
| 2008/0112035 A1 | 5/2008 | Cummings |
| 2008/0158645 A1 | 7/2008 | Chiang |
| 2008/0186581 A1 | 8/2008 | Bita et al. |
| 2008/0239455 A1 | 10/2008 | Kogut et al. |
| 2008/0247028 A1 | 10/2008 | Chui et al. |
| 2008/0278787 A1 | 11/2008 | Sasagawa |
| 2008/0278788 A1 | 11/2008 | Sasagawa |
| 2008/0297880 A1 | 12/2008 | Steckl et al. |
| 2008/0316566 A1 | 12/2008 | Lan |
| 2008/0316568 A1 | 12/2008 | Griffiths et al. |
| 2009/0021884 A1 | 1/2009 | Nakamura |
| 2009/0068781 A1 | 3/2009 | Tung et al. |
| 2009/0073534 A1 | 3/2009 | Lee et al. |
| 2009/0073539 A1 | 3/2009 | Mignard |
| 2009/0078316 A1 | 3/2009 | Khazeni |
| 2009/0080060 A1 | 3/2009 | Sampsell et al. |
| 2009/0101192 A1 | 4/2009 | Kothari et al. |
| 2009/0103166 A1 | 4/2009 | Khazeni et al. |
| 2009/0122384 A1 | 5/2009 | Felnhofer et al. |
| 2009/0126777 A1 | 5/2009 | Khazeni et al. |
| 2009/0135465 A1 | 5/2009 | Chui |
| 2009/0147343 A1 | 6/2009 | Kogut et al. |
| 2009/0159123 A1 | 6/2009 | Kothari |
| 2009/0201566 A1 | 8/2009 | Kothari |
| 2009/0211885 A1 | 8/2009 | Steeneken et al. |
| 2009/0213450 A1 | 8/2009 | Sampsell |
| 2009/0213451 A1 | 8/2009 | Tung et al. |
| 2009/0225395 A1 | 9/2009 | Ganti et al. |
| 2009/0231666 A1 | 9/2009 | Gudlavalleti et al. |
| 2009/0251761 A1 | 10/2009 | Khazeni et al. |
| 2009/0256218 A1 | 10/2009 | Mignard et al. |
| 2009/0257105 A1 | 10/2009 | Xu et al. |
| 2009/0273823 A1 | 11/2009 | Tung et al. |
| 2009/0273824 A1 | 11/2009 | Sasagawa |
| 2009/0279162 A1 | 11/2009 | Chui |
| 2009/0293955 A1 | 12/2009 | Kothari et al. |
| 2009/0323153 A1 | 12/2009 | Sampsell |
| 2009/0323165 A1 | 12/2009 | Sampsell |
| 2009/0323166 A1 | 12/2009 | Sampsell |
| 2010/0014148 A1 | 1/2010 | Djordjev |
| 2010/0039370 A1 | 2/2010 | Miles |
| 2010/0051089 A1 | 3/2010 | Khazeni et al. |
| 2010/0053148 A1 | 3/2010 | Khazeni et al. |

| | | | |
|---|---|---|---|
| 2010/0080890 | A1 | 4/2010 | Tung et al. |
| 2010/0085626 | A1 | 4/2010 | Tung et al. |
| 2010/0096006 | A1 | 4/2010 | Griffiths |
| 2010/0096011 | A1 | 4/2010 | Griffiths |
| 2010/0118382 | A1 | 5/2010 | Kothari et al. |
| 2010/0128337 | A1 | 5/2010 | Tung |
| 2010/0236624 | A1 | 9/2010 | Khazeni et al. |
| 2010/0238572 | A1 | 9/2010 | Tao et al. |
| 2010/0309572 | A1 | 12/2010 | Mignard |
| 2011/0019380 | A1 | 1/2011 | Miles |
| 2011/0026095 | A1 | 2/2011 | Kothari et al. |
| 2011/0026096 | A1 | 2/2011 | Miles |
| 2011/0038027 | A1 | 2/2011 | Miles |
| 2011/0044496 | A1 | 2/2011 | Chui et al. |
| 2011/0069371 | A1 | 3/2011 | Kothari et al. |
| 2011/0080632 | A1 | 4/2011 | Miles |
| 2011/0090554 | A1 | 4/2011 | Tung |
| 2011/0116156 | A1 | 5/2011 | Kothari |
| 2011/0134505 | A1 | 6/2011 | Sasagawa |
| 2011/0170166 | A1 | 7/2011 | Miles |
| 2011/0170167 | A1 | 7/2011 | Miles |
| 2011/0170168 | A1 | 7/2011 | Endisch et al. |
| 2011/0188109 | A1 | 8/2011 | Chui et al. |
| 2011/0188110 | A1 | 8/2011 | Miles |
| 2011/0194169 | A1 | 8/2011 | Ganti et al. |

FOREIGN PATENT DOCUMENTS

| | | |
|---|---|---|
| EP | 0 035 299 | 9/1983 |
| EP | 0 668 490 | 8/1995 |
| EP | 0 695 959 | 2/1996 |
| EP | 0 879 991 | 11/1998 |
| EP | 0 969 306 | 1/2000 |
| EP | 0 986 077 | 3/2000 |
| EP | 1 122 577 | 8/2001 |
| EP | 1 205 782 | 5/2002 |
| EP | 1 227 346 | 7/2002 |
| EP | 1 275 997 | 1/2003 |
| EP | 1 403 212 | 3/2004 |
| EP | 1 473 581 | 11/2004 |
| EP | 1 928 028 | 6/2008 |
| JP | 56-088111 | 7/1981 |
| JP | 5-49238 | 2/1993 |
| JP | 5-281479 | 10/1993 |
| JP | 08-051230 | 2/1996 |
| JP | 11211999 | 8/1999 |
| JP | 2002-062490 | 2/2000 |
| JP | 2000 147262 | 5/2000 |
| JP | 2001-221913 | 8/2001 |
| JP | 2001 249283 | 9/2001 |
| JP | 2002-221678 | 8/2002 |
| JP | 2003-340795 | 2/2003 |
| JP | 2003 177336 | 6/2003 |
| JP | 2004-012642 | 1/2004 |
| JP | 2004-212638 | 7/2004 |
| JP | 2004-212680 | 7/2004 |
| JP | 2005 279831 | 10/2005 |
| JP | 2005-308871 | 11/2005 |
| JP | 2007 027150 | 2/2007 |
| WO | WO 98/14804 | 4/1998 |
| WO | WO 98/43129 | 10/1998 |
| WO | WO 01/53113 | 7/2001 |
| WO | WO 02/024570 | 3/2002 |
| WO | WO 02/086582 | 10/2002 |
| WO | WO 03/105198 | 12/2003 |
| WO | WO 2006/035698 | 4/2006 |
| WO | WO 2007/036422 | 4/2007 |
| WO | WO 2007/045875 | 4/2007 |
| WO | WO 2007/053438 | 5/2007 |
| WO | WO 2007/072998 | 6/2007 |
| WO | WO 2008/062363 | 5/2008 |

OTHER PUBLICATIONS

Feenstra et al., Electrowetting displays, Liquivista BV, 16 pp., Jan. 2006.

Jerman et al., "A Miniature Fabry-Perot Interferometer with a Corrugated Silicon Diaphragm Support", (1988).

Jerman et al., "Miniature Fabry-Perot Interferometers Micromachined in Silicon for Use in Optical Fiber WDM Systems," Transducers, San Francisco, Jun. 24-27, 1991, Proceedings on the Int'l. Conf. on Solid State Sensors and Actuators, vol. CONF. 6, Jun. 24, 1991, pp. 372-375.

Kowarz et al., Conformal grating electromechanical system (GEMS) for high-speed digital light modulation, Proceedings of the IEEE 15th. Annual International Conference on Micro Electro Mechanical Systems, MEMS 2002, pp. 568-573.

Lezec, Submicrometer dimple array based interference color field displays and sensors, Nano Lett. 7(2):329-333, Dec. 23, 2006.

Longhurst, 1963, Chapter IX: Multiple Beam Interferometry, in Geometrical and Physical Optics, pp. 153-157.

Miles, A New Reflective FPD Technology Using Interferometric Modulation, Journal of the SID, 5/4, 1997.

Miles, Interferometric modulation: MOEMS as an enabling technology for high performance reflective displays, Proceedings of SPIE, vol. 4985, pp. 131-139, 2003.

Pape et al., Characteristics of the deformable mirror device for optical information processing, Optical Engineering, 22(6):676-681, Nov.-Dec. 1983.

Taii et al., "A transparent sheet display by plastic MEMS," Journal of the SID 14(8):735-741, 2006.

Tolansky, 1948, Chapter II: Multiple-Beam Interference, in Multiple-bean Interferometry of Surfaces and Films, Oxford at the Clarendon Press, pp. 8-11.

Billard, Tunable Capacitor, 5th Annual Review of LETI, Jun. 24, 2003, p. 7.

Hohlfeld et al., Jun. 2003, Micro-machined tunable optical filters with optimized band-pass spectrum, 12th International Conference on Transducers, Solid-State Sensors, Actuators and Microsystems, 2:1494-1497.

Mehregany et al., 1996, MEMS applications in optical systems, IEEE/LEOS 1996 Summer Topical Meetings, pp. 75-76.

Miles et al, Oct. 21, 1997, A MEMS based interferometric modulator (IMOD) for display applications, Proceedings of Sensors Expo, pp. 281-284.

Nieminen et al., 2004, Design of a temperature-stable RF MEM capacitor, IEEE Journal of Microelectromechanical Systems, 13(5):705-714.

Wang, Jun. 29-Jul. 1, 2002, Design and fabrication of a novel two-dimension MEMS-based tunable capacitor, IEEE 2002 International Conference on Communications, Circuits and Systems and West Sino Expositions, 2:1766-1769.

Invitation to Pay Additional Fees dated Dec. 20, 2010 in PCT/US10/048997.

ISR and WO dated Mar. 3, 2011 in PCT/US10/048997.

Qualcomm MEMS Technologies, Inc., May 2008, Interferometric Modulator (IMOD) Technology Overview, White Paper, 14 pp.

Brosnihan et al., Jun. 2003, Optical IMEMS—a fabrication process for MEMS optical switches with integrated on-chip electronic, Transducers, Solid-State Sensors, Actuators and Microsystems, 12th International Conference 2003, 2(8-12):1638-1642.

Cacharelis et al., 1997, A Reflective-mode PDLC Light Valve Display Technology, Proceedings of European Solid State Device Research Conference (ESSDERC), pp. 596-599.

Dokmeci et al., Dec. 2004, Two-axis single-crystal silicon micromirror arrays, Journal of Microelectromechanical Systems, 13(6):1006-1017.

Maier et al., 1996, 1.3" active matrix liquid crystal spatial light modulator with 508 dpi resolution, SPIE vol. 2754, pp. 171-179.

Londergan et al., Advanced processes for MEMS-based displays, Proceedings of the Asia Display 2007, SID, 1:107-112.

Nakagawa et al., Feb. 1, 2002, Wide-field-of-view narrow-band spectral filters based on photonic crystal nanocavities, Optics Letters, 27(3):191-193.

IPRP dated Nov. 28, 2011 in PCT/US10/048997.

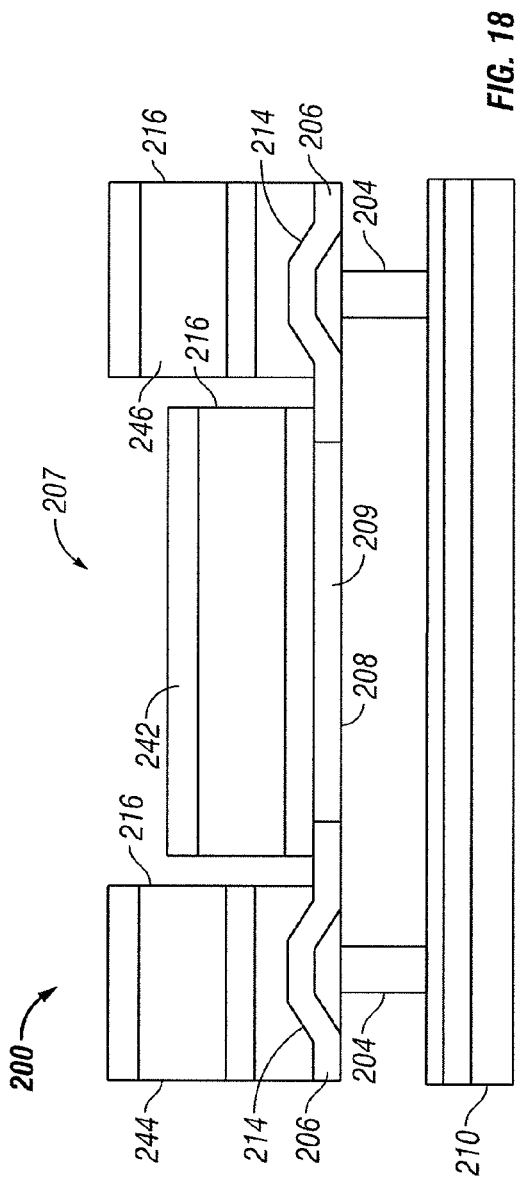
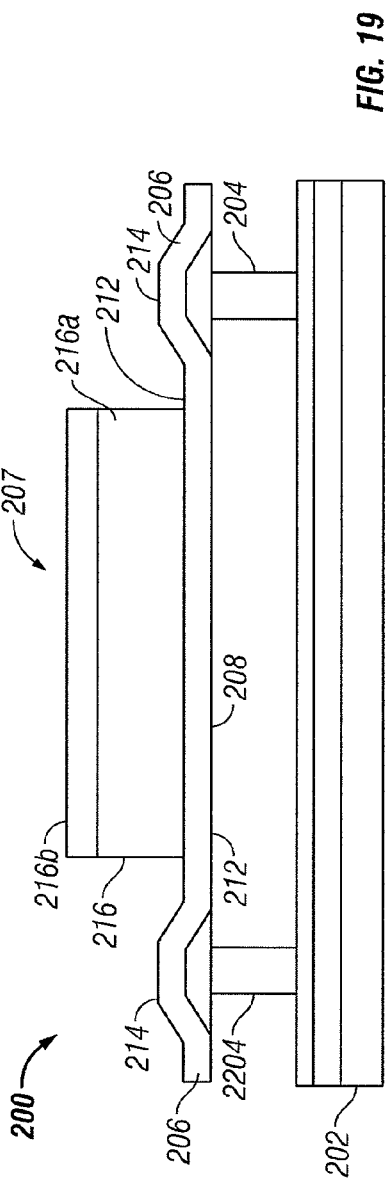

DISPLAY DEVICE WITH AT LEAST ONE MOVABLE STOP ELEMENT

BACKGROUND

1. Field of the Invention

This invention relates to electromechanical systems. More particularly, this invention relates to methods and apparatus for improving the performance of electromechanical systems such as interferometric modulators.

2. Description of the Related Art

Electromechanical systems include devices having electrical and mechanical elements, actuators, transducers, sensors, optical components (e.g., mirrors), and electronics. Electromechanical systems can be manufactured at a variety of scales including, but not limited to, microscales and nanoscales. For example, microelectromechanical systems (MEMS) devices can include structures having sizes ranging from about a micron to hundreds of microns or more. Nanoelectromechanical systems (NEMS) devices can include structures having sizes smaller than a micron including, for example, sizes smaller than several hundred nanometers. Electromechanical elements may be created using deposition, etching, lithography, and/or other micromachining processes that etch away parts of substrates and/or deposited material layers or that add layers to form electrical and electromechanical devices. One type of electromechanical systems device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY

In certain embodiments, a device is provided comprising a substrate and a plurality of supports over the substrate. The device may also comprise a mechanical layer comprising a movable portion and a stationary portion. The stationary portion is disposed over the supports in certain embodiments. A reflective surface may be positioned over the substrate and be mechanically coupled to the movable portion. In certain embodiments, at least one movable stop element displaced from and mechanically coupled to the movable portion. The stop element of certain embodiments is positioned over at least a portion of the stationary portion.

According to certain embodiments, a device is provided comprising a means for reflecting light and a first supporting means for supporting the reflecting means. Certain embodiments comprise a second supporting means for supporting the reflecting means over the first supporting means and for moving the reflecting means relative to the first supporting means. The second supporting means may comprise a movable portion and a stationary portion. The device of certain embodiments further comprises means for stopping movement of the reflecting means. The stopping means may be positioned over at least the stationary portion of the second supporting means.

In certain embodiments, a method of modulating light is provided. The method of certain embodiments comprises providing a device comprising a substrate, a plurality of supports over the substrate, and a mechanical layer comprising a movable portion and a stationary portion, the stationary portion disposed over the supports. The device of certain embodiments further comprises a reflective surface positioned over the substrate and mechanically coupled to the movable portion. In certain embodiments, the device further comprises at least one movable stop element displaced from and mechanically coupled to the reflective surface. The stop element of certain embodiments is positioned over the stationary portion. In certain embodiments, the method further comprises moving the reflective surface relative to the substrate.

According to certain embodiments, a method of manufacturing a device is provided comprising forming a plurality of supports over a substrate and forming a mechanical layer over the supports. The mechanical layer of certain embodiments comprises a movable portion and a stationary portion disposed over the supports. In certain embodiments, the method further comprises forming a movable element over the substrate comprising a reflective surface. The movable element of certain embodiments is mechanically coupled to the movable portion. In certain embodiments, the method further comprises forming at least one movable stop element over the stationary portion. The stop element of certain embodiments is displaced from and mechanically coupled to the movable portion.

In certain embodiments, a device is provided comprising a substrate, a plurality of supports over the substrate, and a mechanical layer comprising a movable portion and a stationary portion. In certain embodiments, the movable portion has a first thickness and the stationary portion is disposed over the supports. The device of certain embodiments further comprises a movable element positioned over the substrate and mechanically coupled to the movable portions. The movable element may further comprise a reflective surface and a stiffener portion positioned above the movable portion and positioned above and mechanically coupled to the reflective surface. In certain embodiments, the stiffener portion extends along a substantial fraction of the area of the reflective surface.

A device according to certain embodiments is provided, comprising a means for reflecting light. The device may further comprise a first supporting means for supporting the reflecting means. In certain embodiments, the device further comprises a second supporting means for supporting the reflecting means over the first supporting means and for moving the reflecting means relative to the first supporting means. The second supporting means of certain embodiments comprises a movable portion and a stationary portion. In certain embodiments, the device comprises a means for stiffening the reflecting means and positioned above the movable portion and positioned above and mechanically coupled to the reflecting means.

In certain embodiments a method of modulating light is provided. The method comprises providing a device. In certain embodiments, the device comprises a substrate. In certain embodiments, the device further comprises a plurality of supports over the substrate and a mechanical layer comprising a movable portion and a stationary portion. The stationary portion of certain embodiments is disposed over the supports. In certain embodiments, the device further comprises a movable element positioned over the substrate and mechanically coupled to the movable portion. The movable element may comprise a reflective surface and a stiffener portion positioned above the movable portion and positioned above and mechanically coupled to the reflective surface. The stiffener portion of certain embodiments extends along a substantial fraction of the area of the reflective surface. In certain embodiments, the method further comprises moving the reflective surface relative to the substrate.

A method of manufacturing a device is provided in certain embodiments comprising forming a plurality of supports over a substrate. The method may further include forming a mechanical layer over the supports comprising a movable portion and a stationary portion wherein the stationary portion is disposed over the supports. In certain embodiments, the method further comprises forming a movable element positioned over the substrate and mechanically coupled to the movable portion. The movable element may comprise a reflective surface. The method of certain embodiments further includes forming a stiffener portion positioned above the movable portion and positioned above and mechanically coupled to the reflective surface. In certain embodiments, the stiffener portion extends along a substantial fraction of the area of the reflective surface.

BRIEF DESCRIPTION OF THE DRAWINGS

FIG. 18 schematically illustrates an example device including a stiffener portion positioned over the reflective surface and over the support posts of the device in accordance with certain embodiments described herein.

FIG. 19 schematically illustrates another example device according to certain embodiments described herein.

DETAILED DESCRIPTION

The following detailed description is directed to certain specific embodiments. However, the teachings herein can be applied in a multitude of different ways. In this description, reference is made to the drawings wherein like parts are designated with like numerals throughout. The embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

In certain embodiments, a MEMS interferometric modulator device is provided that includes a movable stop element. The device includes a mechanical layer coupled to a plurality of support posts which are positioned over a substrate. A reflective surface is positioned over the substrate and is movably coupled to a portion of the mechanical layer such that the reflective surface can be actuated to move towards the substrate. A stop element is displaced from and mechanically coupled to the reflective surface. The stop element is configured to stop the movement of the reflective surface towards the substrate by coming into contact with a portion of the support posts or a portion of the mechanical layer disposed over the support posts.

Figure 1:
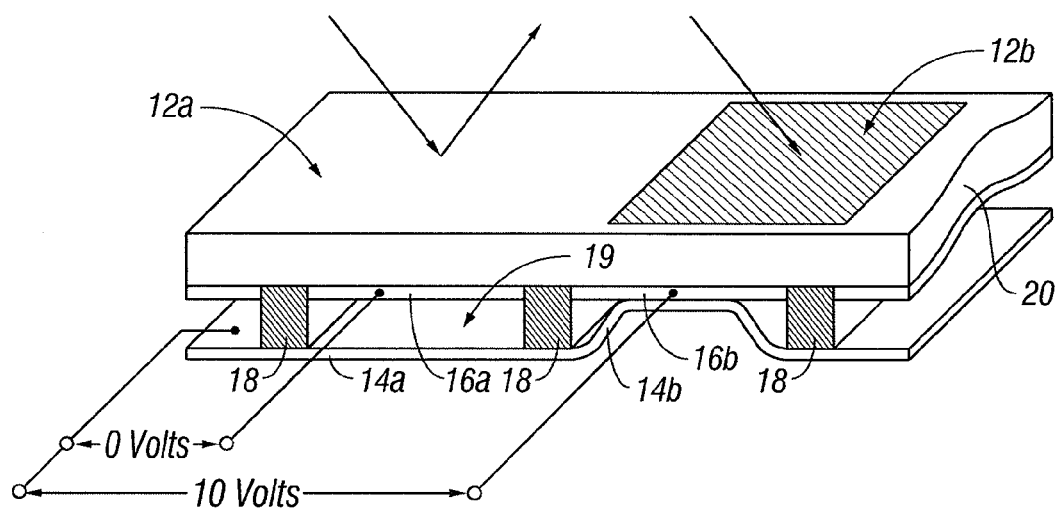
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("relaxed" or "open") state, the display element reflects a large portion of incident visible light to a user. When in the dark ("actuated" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical gap with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise several fused layers, which can include an electrode layer, such as indium tin oxide (ITO), a partially reflective layer, such as chromium, and a transparent dielectric. The optical stack 16 is thus electrically conductive, partially transparent and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack 16 are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) to form columns deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device. Note that FIG. 1 may not be to scale. In some embodiments, the spacing between posts 18 may be on the order of 10-100 um, while the gap 19 may be on the order of <1000 Angstroms.

With no applied voltage, the gap 19 remains between the movable reflective layer 14a and optical stack 16a, with the movable reflective layer 14a in a mechanically relaxed state, as illustrated by the pixel 12a in FIG. 1. However, when a potential (voltage) difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by actuated pixel 12b on the right in FIG. 1. The behavior is the same regardless of the polarity of the applied potential difference.

FIGS. 2 through 5 illustrate one exemplary process and system for using an array of interferometric modulators in a display application.

Figure 2:
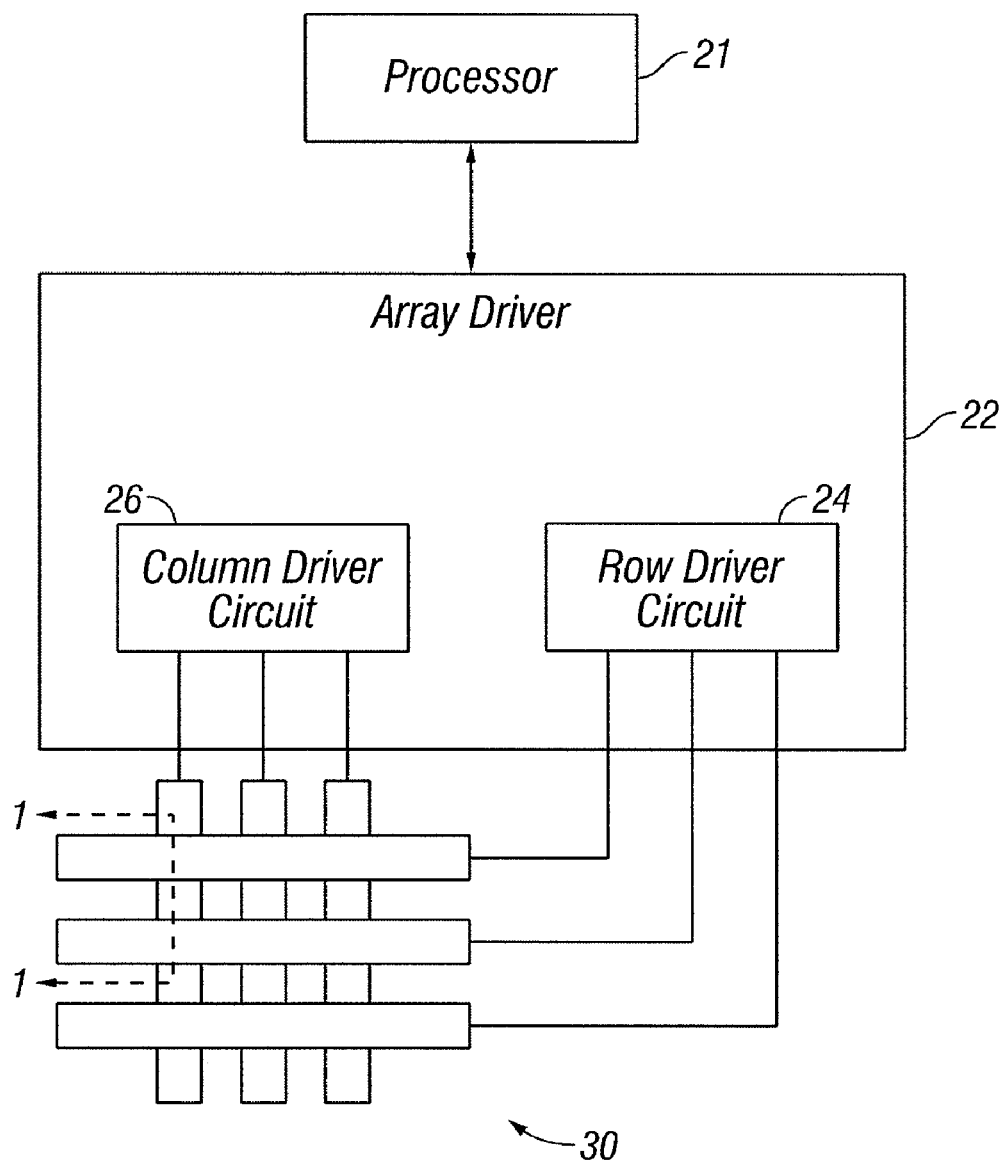
FIG. 2 is a system block diagram illustrating one embodiment of an electronic device incorporating a 3×3 interferometric modulator display.

FIG. 2 is a system block diagram illustrating one embodiment of an electronic device that may incorporate interferometric modulators. The electronic device includes a processor 21 which may be any general purpose single- or multi-chip microprocessor such as an ARM®, Pentium®, 8051, MIPS®, Power PC®, or ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. Note that although FIG. 2 illustrates a 3×3 array of interferometric modulators for the sake of clarity, the display array 30 may contain a very large number of interferometric modulators, and may have a different number of interferometric modulators in rows than in columns (e.g., 300 pixels per row by 190 pixels per column).

Figures 3, 4:
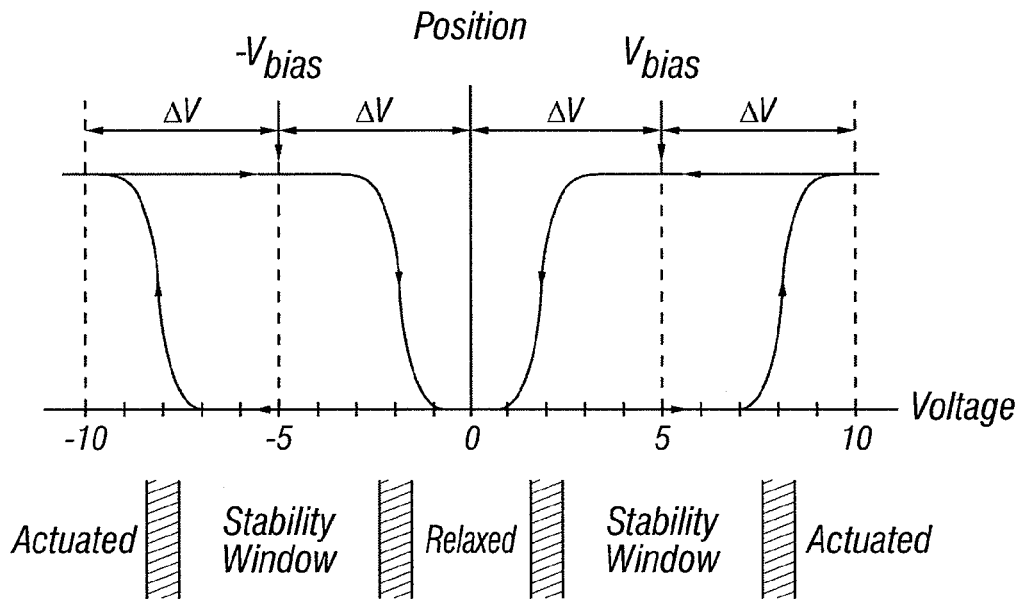
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.

FIG. 3 is a diagram of movable mirror position versus applied voltage for one exemplary embodiment of an interferometric modulator of FIG. 1. For MEMS interferometric modulators, the row/column actuation protocol may take advantage of a hysteresis property of these devices as illustrated in FIG. 3. An interferometric modulator may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. There is thus a range of voltage, about 3 to 7 V in the example illustrated in FIG. 3, where there exists a window of applied voltage within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state or bias voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

As described further below, in typical applications, a frame of an image may be created by sending a set of data signals (each having a certain voltage level) across the set of column electrodes in accordance with the desired set of actuated pixels in the first row. A row pulse is then applied to a first row electrode, actuating the pixels corresponding to the set of data signals. The set of data signals is then changed to correspond to the desired set of actuated pixels in a second row. A pulse is then applied to the second row electrode, actuating the appropriate pixels in the second row in accordance with the data signals. The first row of pixels are unaffected by the second row pulse, and remain in the state they were set to during the first row pulse. This may be repeated for the entire series of rows in a sequential fashion to produce the frame. Generally, the frames are refreshed and/or updated with new image data by continually repeating this process at some desired number of frames per second. A wide variety of protocols for driving row and column electrodes of pixel arrays to produce image frames may be used.

FIGS. 4 and 5 illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts respectively Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

Figure 5A:
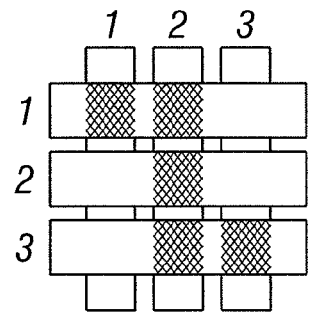
FIGS. 5A and 5B illustrate one exemplary timing diagram for row and column signals that may be used to write a frame of display data to the 3×3 interferometric modulator display of FIG. 2.
Figure 5B:
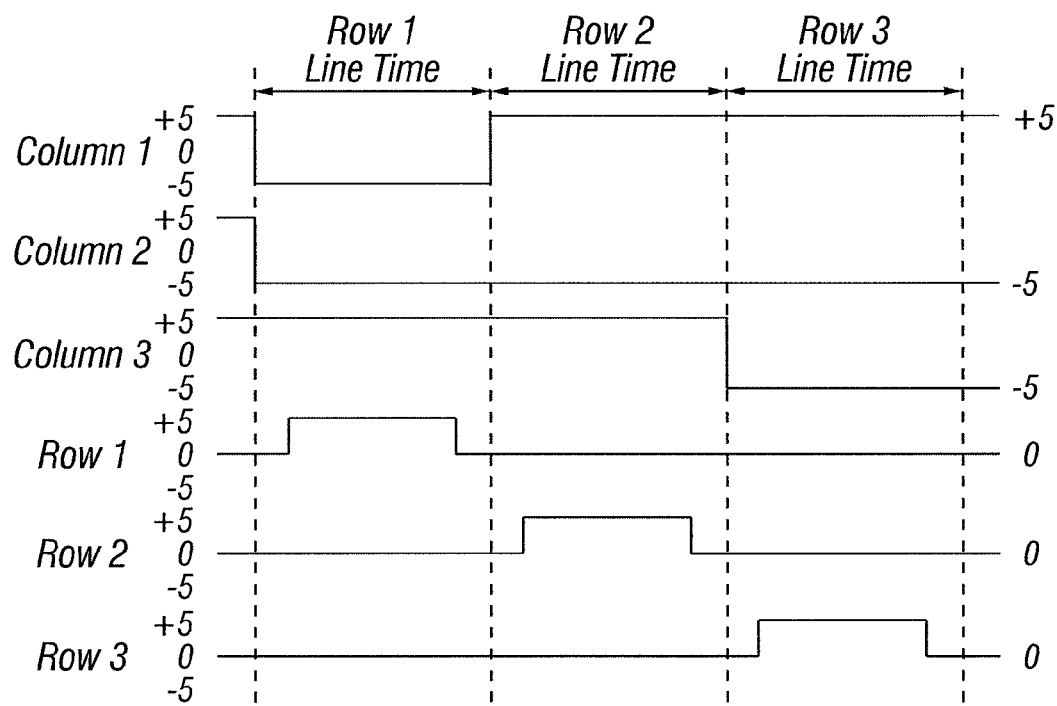

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are initially at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. The same procedure can be employed for arrays of dozens or hundreds of rows and columns. The timing, sequence, and levels of voltages used to perform row and column actuation can be varied widely within the general principles outlined above, and the above example is exemplary only, and any actuation voltage method can be used with the systems and methods described herein.

Figure 6A:
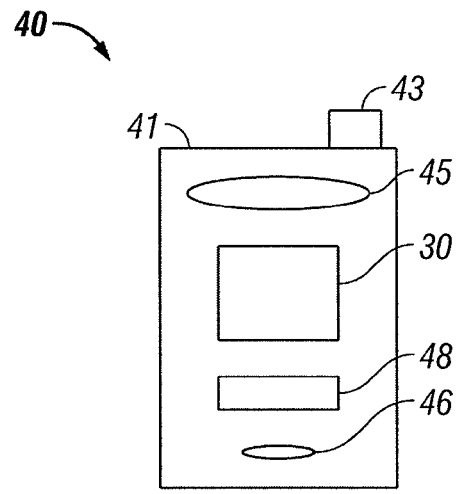
FIGS. 6A and 6B are system block diagrams illustrating an embodiment of a visual display device comprising a plurality of interferometric modulators.
Figure 6B:
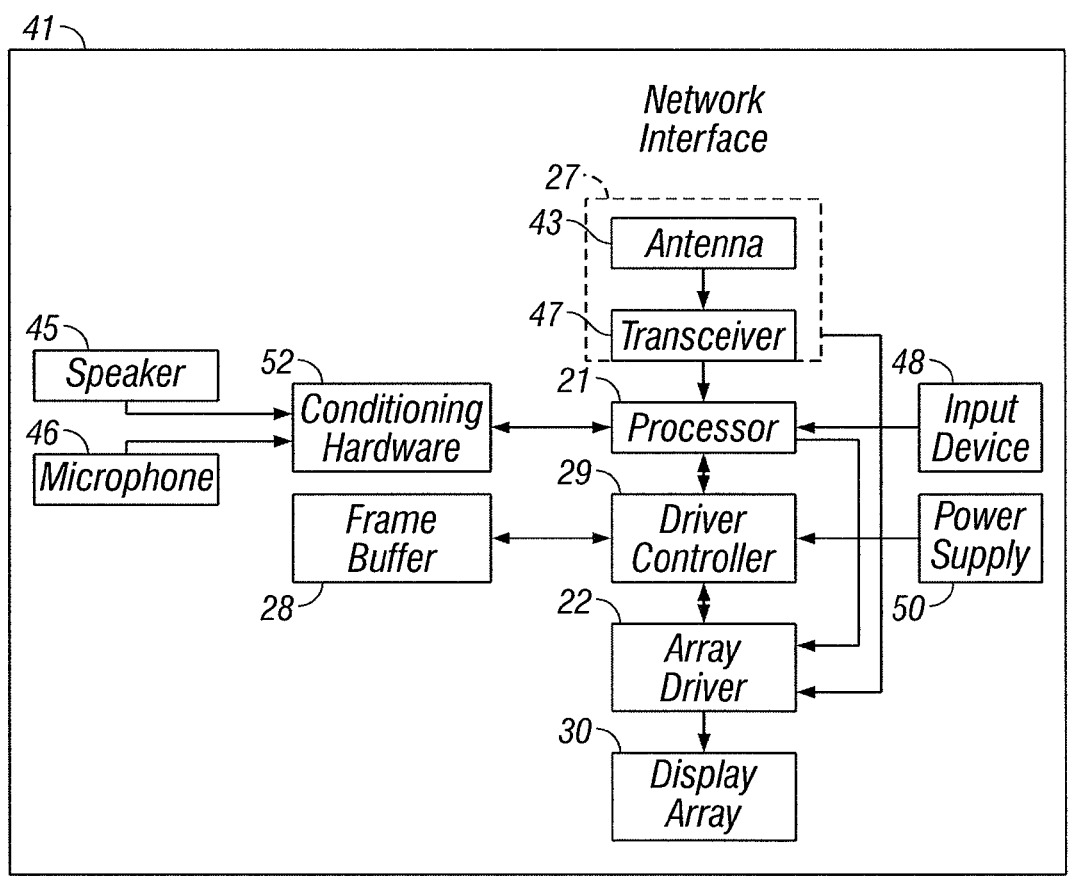

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes, including injection molding, and vacuum forming. In addition, the housing 41 may be made from any of a variety of materials, including but not limited to plastic, metal, glass, rubber, and ceramic, or a combination thereof. In one embodiment the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43 which is coupled to a transceiver 47. The transceiver 47 is connected to a processor 21, which is connected to conditioning hardware 52. The conditioning hardware 52 may be configured to condition a signal (e.g. filter a signal). The conditioning hardware 52 is connected to a speaker 45 and a microphone 46. The processor 21 is also connected to an input device 48 and a driver controller 29. The driver controller 29 is coupled to a frame buffer 28, and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment the network interface 27 may also have some processing capabilities to relieve requirements of the processor 21. The antenna 43 is any antenna for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS, W-CDMA, or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a digital video disc (DVD) or a hard-disc drive that contains image data, or a software module that generates image data.

Processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 45, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, input device 48 includes a keypad, such as a QWERTY keyboard or a telephone keypad, a button, a switch, a touch-sensitive screen, a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

Power supply 50 can include a variety of energy storage devices as are well known in the art. For example, in one embodiment, power supply 50 is a rechargeable battery, such as a nickel-cadmium battery or a lithium ion battery. In another embodiment, power supply 50 is a renewable energy source, a capacitor, or a solar cell, including a plastic solar cell, and solar-cell paint. In another embodiment, power supply 50 is configured to receive power from a wall outlet.

In some implementations control programmability resides, as described above, in a driver controller which can be located in several places in the electronic display system. In some cases control programmability resides in the array driver 22. The above-described optimization may be implemented in any number of hardware and/or software components and in various configurations.

Figure 7A:
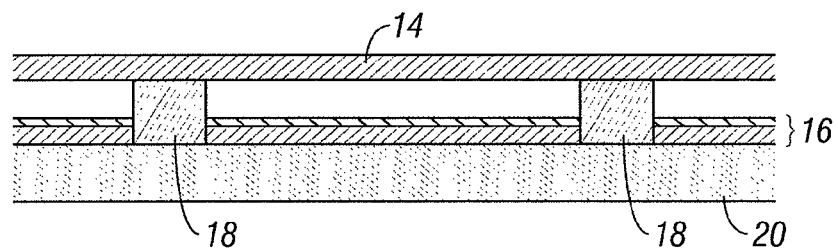
FIG. 7A is a cross section of the device of FIG. 1.
Figure 7B:
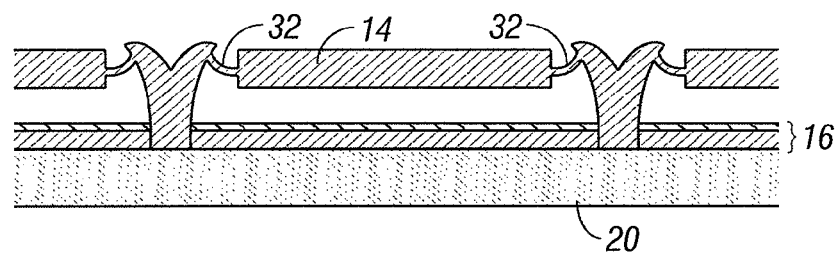
FIG. 7B is a cross section of an alternative embodiment of an interferometric modulator.
Figure 7C:
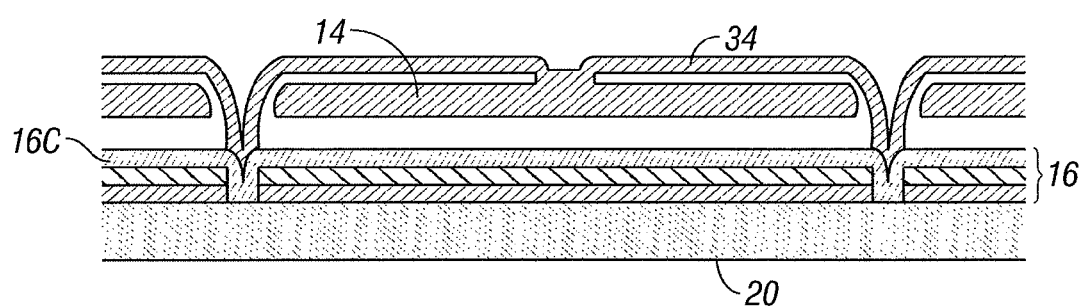
FIG. 7C is a cross section of another alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 of each interferometric modulator is square or rectangular in shape and attached to supports at the corners only, on tethers 32. In FIG. 7C, the moveable reflective layer 14 is square or rectangular in shape and suspended from a deformable layer 34, which may comprise a flexible metal. The deformable layer 34 connects, directly or indirectly, to the substrate 20 around the perimeter of the deformable layer 34. These connections are herein referred to as support posts. The embodiment illustrated in FIG. 7D has support post plugs 42 upon which the deformable layer 34 rests. The movable reflective layer 14 remains suspended over the gap, as in FIGS. 7A-7C, but the deformable layer 34 does not form the support posts by filling holes between the deformable layer 34 and the optical stack 16. Rather, the support posts are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. For example, such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

Figure 7D:
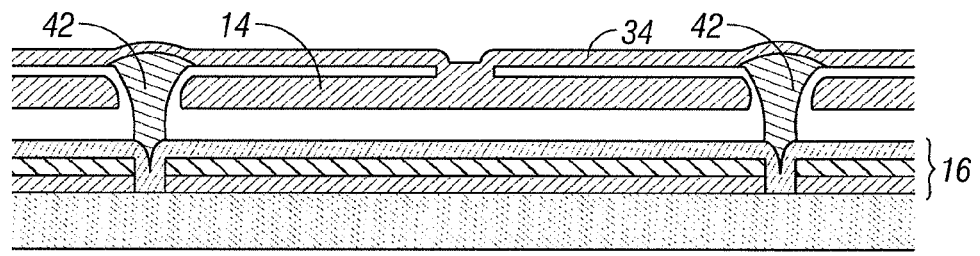
FIG. 7D is a cross section of yet another alternative embodiment of an interferometric modulator.
Figure 7E:
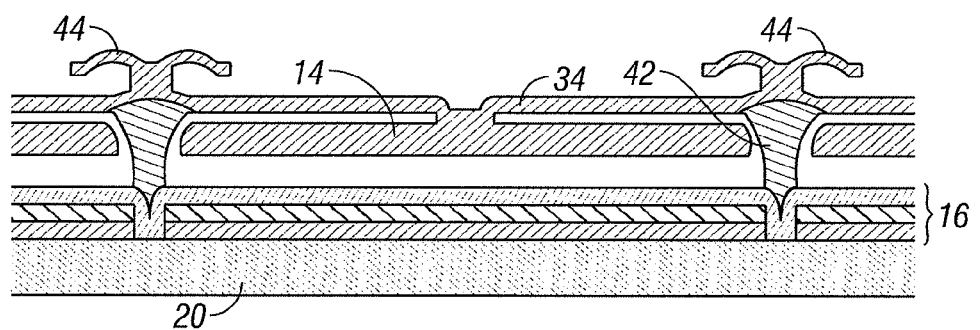
FIG. 7E is a cross section of an additional alternative embodiment of an interferometric modulator.
Figure 8:
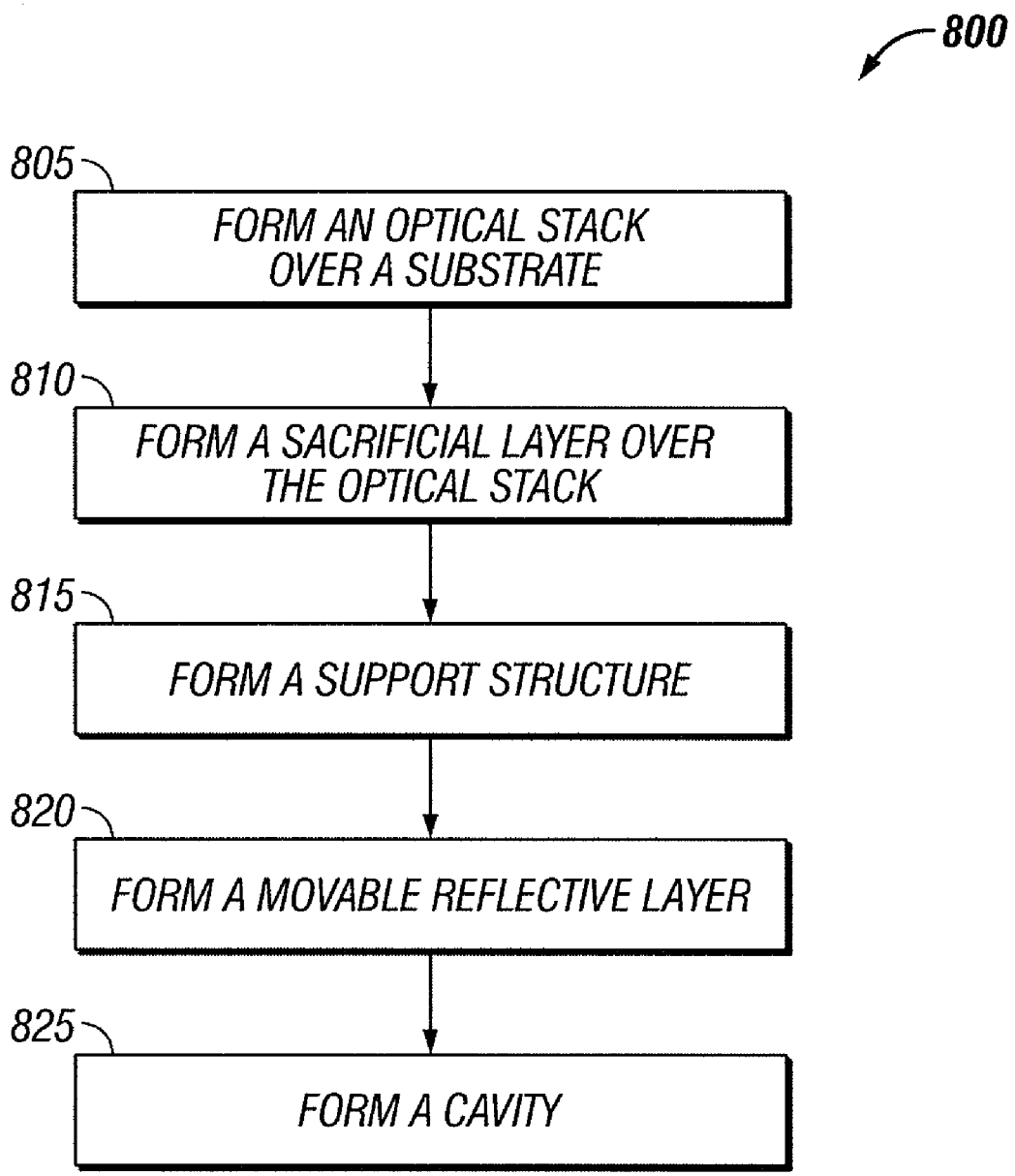
FIG. 8 is a flow diagram illustrating certain steps in an embodiment of a method of making an interferometric modulator.

FIG. 8 illustrates certain steps in an embodiment of a manufacturing process 800 for an optical modulator, such as an interferometric modulator. Such steps may be present in a process for manufacturing, e.g., interferometric modulators of the general type illustrated in FIGS. 1 and 7, along with other steps not shown in FIG. 8. With reference to FIGS. 1, 7 and 8, the process 800 begins at step 805 with the formation of the optical stack 16 over the substrate 20. The substrate 20 may be a transparent substrate such as glass or plastic and may have been subjected to prior preparation step(s), e.g., cleaning, to facilitate efficient formation of the optical stack 16. As discussed above, the optical stack 16 is electrically conductive, partially transparent and partially reflective, and may be fabricated, for example, by depositing one or more of the layers onto the transparent substrate 20. In some embodiments, the layers are patterned into parallel strips, and may form row electrodes in a display device. As used herein, and as will be understood by one of skill in the art, the term "patterned" is used herein to refer to patterning as well as etching processes. In some embodiments, the optical stack 16 includes an insulating or dielectric layer that is deposited over one or more metal layers (e.g., reflective and/or conductive layers).

The process 800 illustrated in FIG. 8 continues at step 810 with the formation of a sacrificial layer over the optical stack 16. The sacrificial layer is later removed (e.g., at step 825) to form the cavity 19 as discussed below and thus the sacrificial layer is not shown in the resulting interferometric modulator 12 illustrated in FIG. 1. The formation of the sacrificial layer over the optical stack 16 may include deposition of a $XeF_2$-etchable material such as molybdenum or amorphous silicon, in a thickness selected to provide, after subsequent removal, a cavity 19 having the desired size. Deposition of the sacrificial material may be carried out using deposition techniques such as physical vapor deposition (PVD, e.g., sputtering), plasma-enhanced chemical vapor deposition (PECVD), thermal chemical vapor deposition (thermal CVD), or spin-coating.

The process 800 illustrated in FIG. 8 continues at step 815 with the formation of a support structure e.g., a post 18 as illustrated in FIGS. 1 and 7. The formation of the post 18 may include the steps of patterning the sacrificial layer to form a support structure aperture, then depositing a material (e.g., a polymer or a silicon oxide) into the aperture to form the post 18, using a deposition method such as PECVD, thermal CVD, or spin-coating. In some embodiments, the support structure aperture formed in the sacrificial layer extends through both the sacrificial layer and the optical stack 16 to the underlying substrate 20, so that the lower end of the post 18 contacts the substrate 20 as illustrated in FIG. 7A. In other embodiments, the aperture formed in the sacrificial layer extends through the sacrificial layer, but not through the optical stack 16. For example, FIG. 7D illustrates the lower end of the support post plugs 42 in contact with the optical stack 16.

The process 800 illustrated in FIG. 8 continues at step 820 with the formation of a movable reflective layer or membrane such as the movable reflective layer 14 illustrated in FIGS. 1 and 7. The movable reflective layer 14 may be formed by employing one or more deposition steps, e.g., reflective layer (e.g., aluminum, aluminum alloy) deposition, along with one or more patterning, masking, and/or etching steps. As discussed above, the movable reflective layer 14 is typically electrically conductive, and may be referred to herein as an electrically conductive layer. Since the sacrificial layer is still present in the partially fabricated interferometric modulator formed at step 820 of the process 800, the movable reflective layer 14 is typically not movable at this stage. A partially fabricated interferometric modulator that contains a sacrificial layer may be referred to herein as an "unreleased" interferometric modulator.

The process 800 illustrated in FIG. 8 continues at step 825 with the formation of a cavity, e.g., a cavity 19 as illustrated in FIGS. 1 and 7. The cavity 19 may be formed by exposing the sacrificial material (deposited at step 810) to an etchant. For example, an etchable sacrificial material such as molybdenum or amorphous silicon may be removed by dry chemical etching, e.g., by exposing the sacrificial layer to a gaseous or vaporous etchant, such as vapors derived from solid xenon difluoride (XeF$_2$) for a period of time that is effective to remove the desired amount of material, typically selectively relative to the structures surrounding the cavity 19. Other etching methods, e.g. wet etching and/or plasma etching, may also be used. Since the sacrificial layer is removed during step 825 of the process 800, the movable reflective layer 14 is typically movable after this stage. After removal of the sacrificial material, the resulting fully or partially fabricated interferometric modulator may be referred to herein as a "released" interferometric modulator.

In some embodiments, a MEMS display can comprise one or more pixels that each comprise a plurality of sub-pixels. Each sub-pixel can comprise an independently movable and/or independently actuatable optical modulator. By such a configuration, a single pixel can be configured to reflect multiple colors, depending on the particular configuration of the individual sub-pixels and the selection of sub-pixels that are actuated. For example, in one embodiment, a MEMS display can be configured with pixels that are divided into nine sub-pixels, with three sub-pixels in a column configured to reflect blue light, three sub-pixels in an adjacent column configured to reflect green light, and three sub-pixels in the next column configured to reflect red light in their unactuated (relaxed) states. In such a configuration, the modulators in the columns of a given pixel can have differently sized air gaps and/or different thicknesses. In such an example, individually actuating different combinations of sub-pixels causes the pixel to reflect different colors.

Figure 9A:
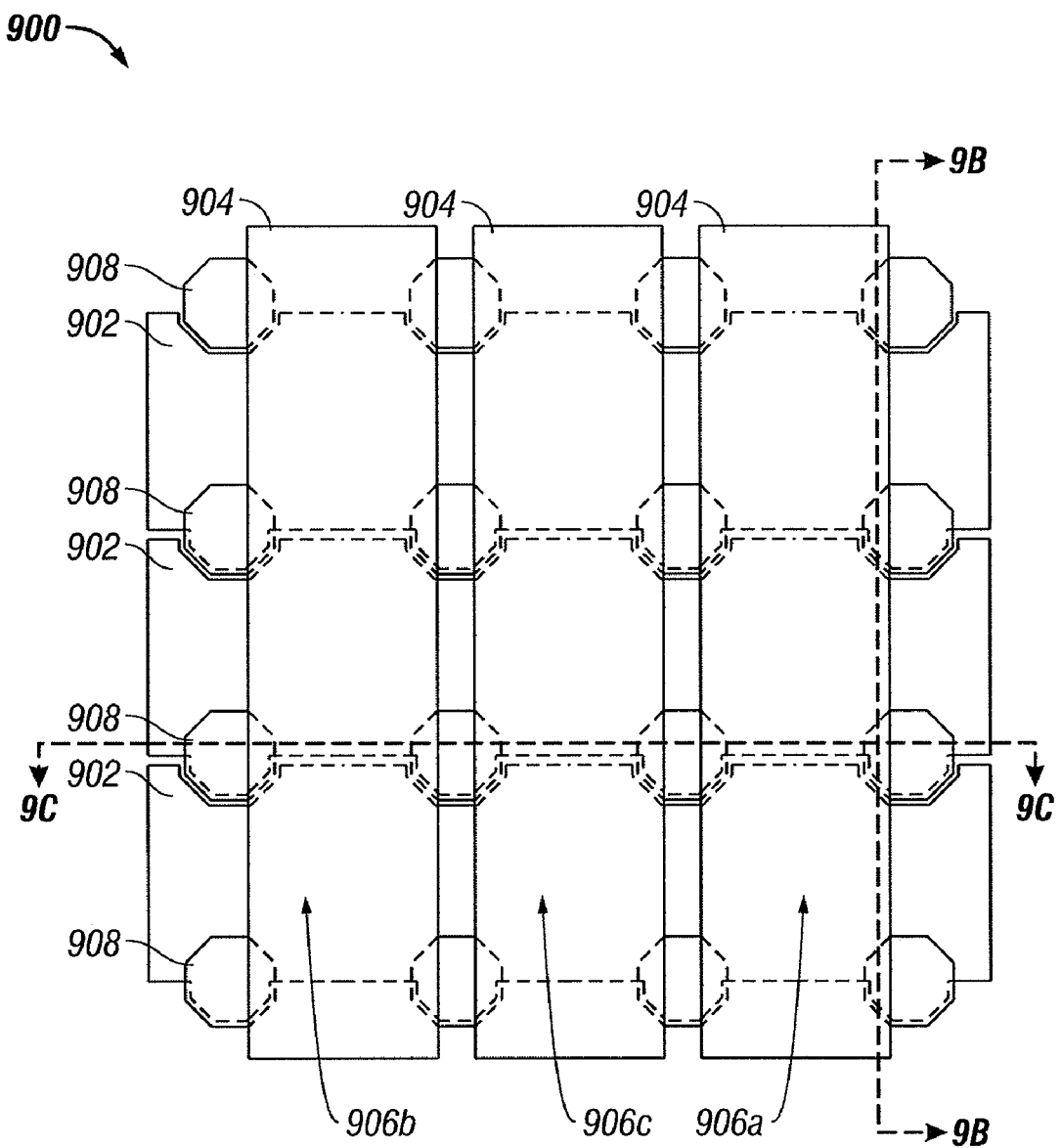
FIG. 9A is a view depicting a portion of one embodiment of an interferometric modulator display.

FIG. 9A is a view depicting a portion of one embodiment of an interferometric modulator display 900 that includes three parallel row electrodes 902 and three strips 904 of a deformable (or otherwise movable) reflective layer, arranged in columns extending perpendicular to the row electrodes 902. In the illustrated embodiment, the overlapping portions of the row electrodes 902 and the column electrodes 904 define nine sub-pixels 906 (comprising three each of sub-pixels 906a, 906b, and 906c). Supports 908 are disposed at corner regions of each sub-pixel, on or near border regions of the row electrodes 902, and are configured to support edge portions of the column electrodes 904. Those skilled in the art will understand that row electrodes can be electrically conductive portions of the optical stack. For example, in some embodiments, reference to row electrodes in this and the following discussion will be understood as a reference to the electrically conductive metal layer(s) (e.g., ITO) of an optical stack, such as the optical stack 16 illustrated in FIGS. 7A-7E. Although some of the drawings depicting the row electrodes may omit other layer(s) of the optical stack (such as a partially reflective layer, and/or one or more transparent dielectric layers) for clarity, those skilled in the art will understand that such other layer(s) may be present as desired for particular applications. Column electrodes can comprise one or more layers which can be light-reflective and electrically conductive, and can be movable towards the optical stack.

Figure 9B:
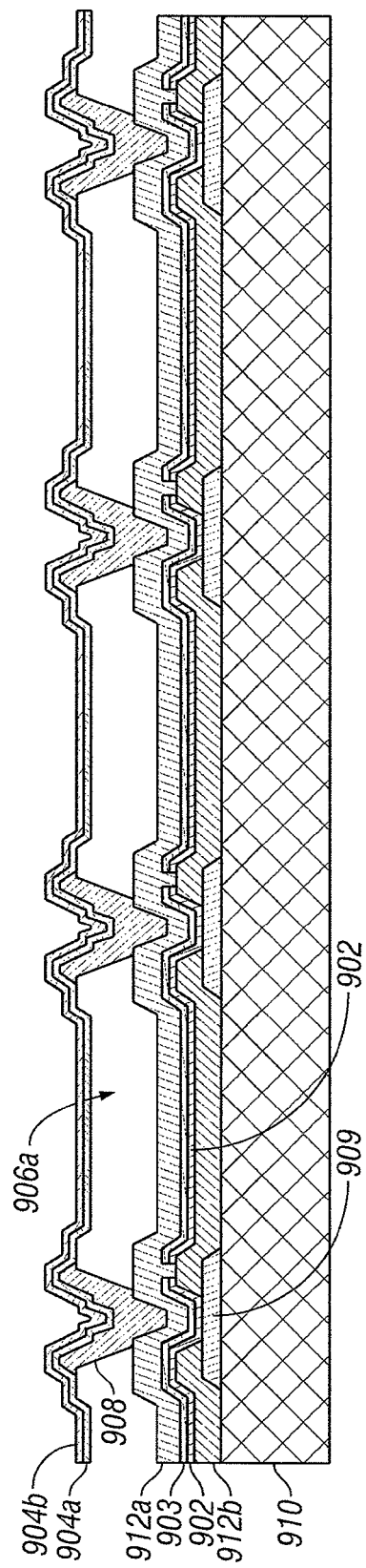
FIG. 9B is a cross section of the device of FIG. 9A, taken along line 9B-9B of FIG. 9A.

FIG. 9B shows a cross-section of a portion of the display 900 illustrated in FIG. 9A, and also shows a substrate 910 underlying the optical stack, which includes row electrodes 902, a partially reflective and partially transmissive layer 903, and dielectric layers 912a, 912b. Also illustrated in FIG. 9B are optical mask structures 909 underlying the supports 908. The optical mask structures 909, also referred to as "black mask" structures, can be configured to absorb ambient or stray light and to improve the optical response of a display device by increasing the contrast ratio. In some applications, the optical mask can reflect light of a predetermined wavelength to appear as a color other than black. The optical mask structures can also be conductive, and thus can be configured to function as an electrical bussing layer. The conductive bus structures can be configured with a lower electrical resistance than the row and/or column electrodes themselves, to improve the response time of the sub-pixels in an array. A conductive bus structure can also be provided separately from the optical mask structure. A conductive mask or other conductive bus structure can be electrically coupled to one or more of the elements on the display to provide one or more electrical paths for voltages applied to one or more of the display elements. For example, depending on the configuration desired, one or more of the row or column electrodes can be connected to the conductive bus structure to reduce the resistance of the connected row or column electrode. In some embodiments, the conductive bus structures can be connected to the row electrodes 902 through one or more vias (not shown in FIG. 9B), which can be disposed underneath the supports 908 or in any other suitable location.

In some embodiments, the column electrodes 904 can comprise multiple layers. For example, the column electrode 904 illustrated in FIG. 9B comprises a reflective layer 904a and a flexible layer 904b. In some embodiments, the flexible layer 904b can be formed directly over and/or in continuous contact with the reflective layer 904a. Depending on the particular application, the flexible layer 904b can comprise a dielectric material, a conductive material, or any other suitable material. In some embodiments, the reflective layer 904a comprises aluminum. In certain embodiments, the flexible layer 904b comprises the same material as the supports 908 and/or comprise materials having the same our about the same coefficients of thermal expansion (CTEs). For example, the supports 908 and the flexible layer 904 may each comprise a dielectric material (e.g., SiO$_2$).

Figure 9C:
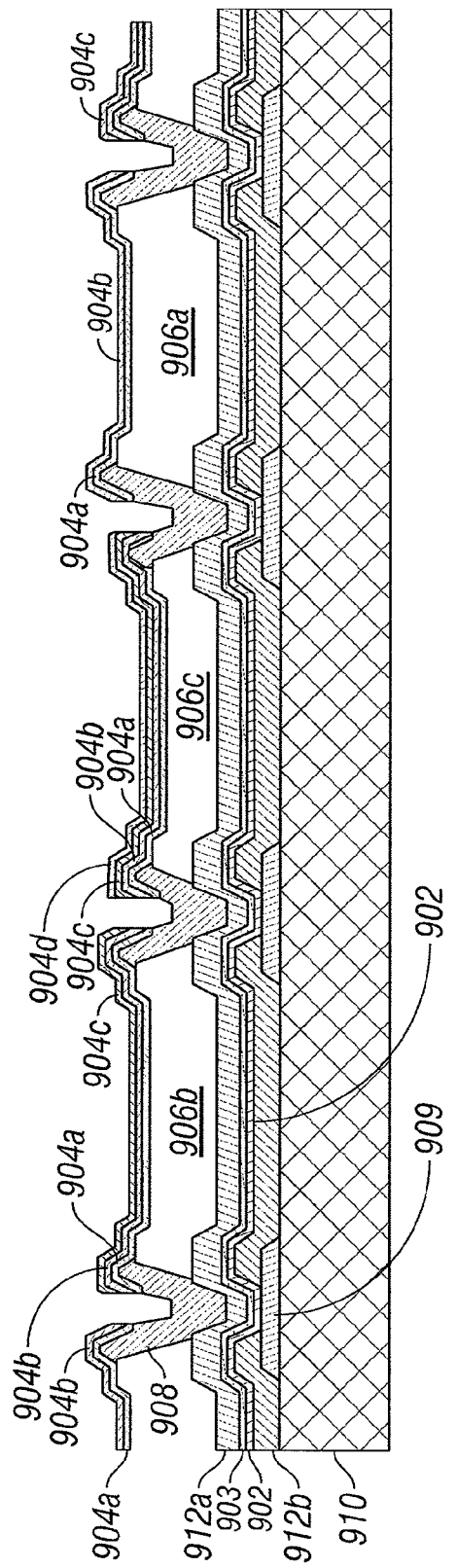
FIG. 9C is a cross section of the device of FIG. 9A, taken along line 9C-9C of FIG. 9A.

In addition, in some embodiments, the columns 904 of a given pixel can have different thicknesses, and/or multiple layers of the same or different thicknesses. For example, as illustrated in FIG. 9C, the column electrode 904 of sub-pixel 906a can comprise a single reflective layer 904a and a single flexible supporting layer 904b. The column electrode 904 of sub-pixel 906b can an additional supporting layer 904c to increase the stiffness of the sub-pixel 906b relative to sub-pixel 906a. In certain embodiments, the additional supporting layer 904c may comprise a material having the same material and thickness as the reflective layer 904a. Such as configuration can balance the overall internal stress of the reflective layer 904a, flexible supporting layer 904b, and the additional supporting layer 904c. The column electrode 904 of sub-pixel 906c can have yet another supporting layer 904d in order to increase the stiffness of the sub-pixel 906c relative to sub-pixel 906b. The various supporting layers 904b, 904c, and 904d can comprise the same or different material, and can have the same or different thicknesses as required by the particular application. Also in some embodiments, the sub-pixels in a display can be configured with differently sized air gaps between their columns and optical stacks. For example, as shown in FIG. 9C, sub-pixel 906a is configured with the relatively largest air gap in the illustrated display, sub-pixel 906b has a somewhat smaller air gap, and sub-pixel 906c is configured with the relatively smallest air gap in the illustrated display. By such a configuration, the sub-pixels in a display can be configured to reflect various desired colors at similar actuation voltages.

The interferometric modulator display 900 can be manufactured using the method 800 of FIG. 8. The row electrodes 902 can be formed at the step 805 as part of the optical stack. The row electrodes 902 can be formed in any suitable fashion, for example, they can be formed as a single layer which is then patterned and etched to separate and electrically isolate the rows 902 from one another. The supports 908 can be formed within apertures formed within the sacrificial layer in a region along the periphery of each sub-pixel to support edge portions of the columns 904 of the deformable reflective layer or membrane. The parallel strips 904 of the movable reflective layer can be formed at step 820. The parallel strips 904 can be formed over the sacrificial layer and the supports 908 so as to be supported when the sacrificial layer is removed at step 825. The parallel strips 904 can be initially formed as a single layer which is then patterned and etched to separate and, thus, physically and electrically isolate the column electrodes 904 from one another.

Figure 10A:
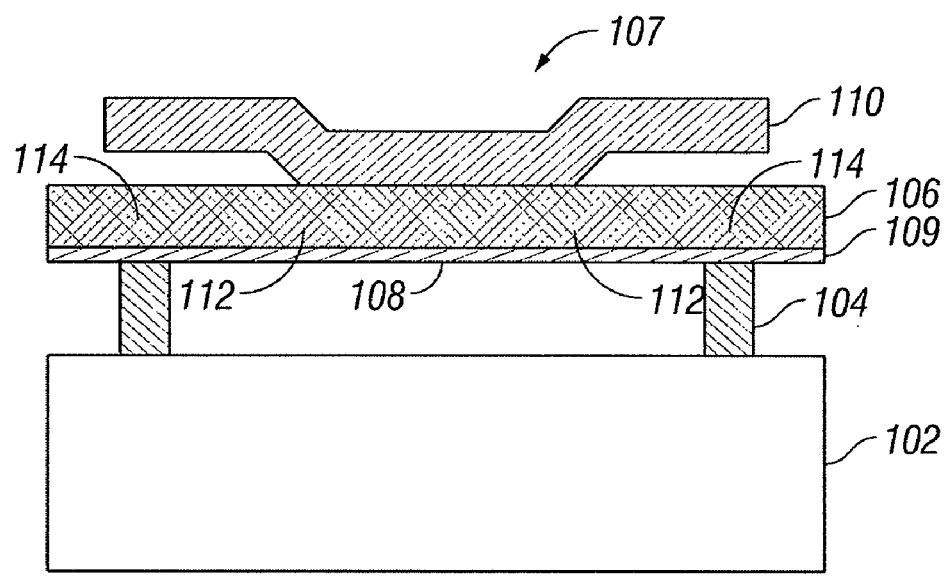
FIG. 10A schematically illustrates an example device in accordance with certain embodiments described herein.

FIG. 10A schematically illustrates an example device 100 including a movable stop element 110 in accordance with certain embodiments described herein. The device 100 comprises a substrate 102, a plurality of supports 104, a mechanical layer 106, a reflective surface 108, and at least one movable stop element 110. In certain embodiments, the supports 104 are positioned over the substrate 102. The mechanical layer 106 of certain embodiments comprises a movable portion 112 and a stationary portion 114. The stationary portion 114 is disposed over the supports 104 in some embodiments. In addition, the reflective surface 108 of certain embodiments is positioned over the substrate 102 and is mechanically coupled to the movable portion 112 of the mechanical layer 106. In certain embodiments, the device 100 further comprises the movable element 107 which includes the reflective surface 108 or a portion thereof. The movable element 107 may also include one or more other movable portions of the device 100 such as the stop element 110 and the movable portion 112.

In some embodiments, the movable stop element 110 is displaced from and mechanically coupled to the movable portion 112. Moreover, at least a portion of the stop element 110 may be positioned over the stationary portion 114 of the mechanical layer 106. For example, in certain embodiments the stop element 110 is positioned at least partially directly over the stationary portion 114. For example, the stop element 110 may be positioned at least partially directly above the stationary portion 114 or a portion thereof. The stop element 110 may also be positioned over the movable portion 112 of the mechanical layer 106 in certain embodiments and/or other portions of the device 100, such as the support posts 104, for example. In certain embodiments, the stop element 110 is at least partially substantially laterally displaced from the reflective surface 108 (e.g., as described with respect to FIGS. 13A and 13B). The stop element 110 of certain embodiments comprises a metal. For example, the stop element 110 may comprise nickel. In other embodiments, the stop element 110 comprises aluminum, aluminum-nickel (e.g., an aluminum-nickel alloy), titanium dioxide ($TiO_2$), some other metal, or some other combination of metals. In certain other embodiments, the stop element 110 comprises some other material such as a dielectric (e.g., silicon dioxide ($SiO_2$)). The thickness of the stop member 110 may vary. For example, in certain embodiments, the thickness may range from about 1,000 to about 10,000 Å. In various embodiments, the stop element 110 may comprise any material having a thickness such that the stop element 110 is strong enough to perform the stopping function of the stop element 110 described herein.

Figure 10B:
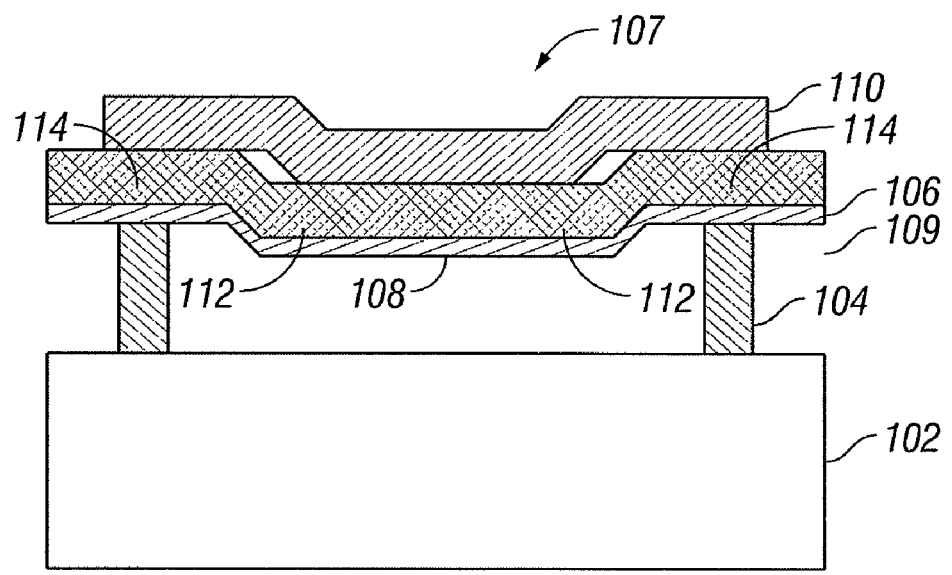
FIG. 10B schematically illustrates the device of FIG. 10A in an actuated state in accordance with certain embodiments described herein.

As shown, in certain embodiments the device 100 is actuatable from a relaxed state (FIG. 10A) to an actuated state (FIG. 10B) by moving the reflective surface 108 in a direction generally perpendicular to the substrate 102. For example, the stop element 110 can move such that it is displaced from the stationary portion 114 when the device 100 is in the relaxed state (FIG. 10A) and contacts the stationary portion 114 when the device 100 is in the actuated state (FIG. 10B). As discussed, for example, the stop element 110 can be positioned over and be displaced from the stationary portion 114 in the relaxed state and move down to and contact the stationary portion 114 in the actuated state. In some embodiments, the stop element 110 can be positioned directly over the stationary portion 114 and move generally straight down towards the stationary portion 114. In other embodiments, the stop element 110 may not be positioned directly over the stationary portion 114 in the relaxed state, but is positioned over and laterally displaced from the stationary portion 114. In such cases, for example, the stop element 110 may move generally downward and laterally (e.g., at an angle) from the relaxed state to the actuated state to contact the stationary portion 114.

Additionally, the stop element 110 may, in some embodiments, move so as to contact some other portion of the device 100 when the device is actuated from the relaxed state to the actuated state. For example, in one embodiment, the mechanical layer 106 may not extend completely over the support posts 104 and the stop element 110 may be displaced from the plurality of supports 104 when the device 100 is in the relaxed state and contact at least one of the plurality of supports 104 when the device 100 is in the actuated state. The device 100 may further include an actuation electrode (not shown). In certain embodiments, the actuation of the device 100 occurs in response to a voltage difference applied between the actuation electrode and one or more of the mechanical layer 106 and the reflective surface 108. Thus, by selectively moving the reflective surface 108 so as to change a spacing between the reflective surface 108 and the substrate 102, the device 100 forms an actuatable interferometric modulator as described herein. In certain embodiments, the device 100 is an actuatable element (e.g., a pixel or sub-pixel) of a display system. By moving the reflective surface 108 with respect to the substrate 102 (e.g., from the relaxed state of FIG. 10A to the actuated state of FIG. 10B), in certain embodiments, one or more properties of light emitted from the device can be modulated.

In certain embodiments, the stop element 110 is rigid or substantially rigid so as to substantially prevent further movement of the reflective surface 108 towards the substrate 102 when the stop element 110 contacts the stationary portion 114. In addition, the interface where the stop element 110 contacts the portion of the stationary portion 114 can be advantageously adapted to reduce stiction. In certain embodiments, the interface is configured to reduce stiction without substantially impacting optical performance because it is not in the optical path. For example, the surface topography of one or more of the stop element 110 and the portion of the stationary portion 114 that contacts the stop element 110 may be roughened to reduce the number of contact points. In another embodiment, an anti-stiction layer may be formed on one or more of the stop element 110 and the portion of the stationary portion 114 that contacts the stop element 110. In addition, the stop element 110 may bend or deflect away from the stationary portions 114 upon contacting the stationary portions 114. Thus, following actuation of the device 100, the stop element 110 may generally act as a spring, thereby improving the release of the reflective surface 108 and other portions of the device back to the un-actuated state following actuation. In certain embodiments, the stop element 110 may have relatively little impact on the actuation parameters (e.g., actuation voltage) while improving the release characteristics of the device 100.

The substrate 102 may comprise a variety of materials. For example, in certain embodiments, the substrate 102 comprises a glass or plastic material. In other embodiments, some other material may be used. The substrate of certain embodiments is transparent or substantially transparent. The support posts 104 of some embodiments may comprise a dielectric material (e.g., $SiO_2$, SiON, $SiO_xN_y$, $SiN_x$, $SiO_x$, etc.). In other embodiments, the support posts 104 may comprise another material, such as a metal, for example. The mechanical layer 106 may comprise metal in some embodiments. For example, the mechanical layer 106 may comprise nickel, nickel alloy, aluminum-nickel, aluminum alloy, aluminum, some other metal, some other alloy, or some other combination of metals. In one embodiment, the mechanical layer 106 comprises nickel and is about 1000 Å thick, for example. In another embodiment, the mechanical layer 106 comprises a bilayer of nickel alloy. In other embodiments, the mechanical layer 106 may comprise a non-metal material or may have other properties (e.g., other thicknesses). For example, the mechanical layer 106 may comprise a dielectric material (e.g., $SiO_2$, SiON, $SiO_xN_y$, $SiN_x$, $SiO_x$, $TiO_2$, TiN, AlN, etc.). In certain embodiments, the thickness of the mechanical layer 106 may range from about 500 Å to about 10,000 Å. In certain other embodiments, the mechanical layer 106 may be less than 500 Å thick or greater than 10,000 Å thick. In addition, the mechanical layer 106 may have a tensile stress ranging up to 1000 MPa, for example.

The movable element 107 of certain embodiments comprises aluminum, an aluminum alloy, aluminum-nickel, chromium, molybdenum-chromium (MoCr), silver, gold, or some other metal or combination of metals. In one embodiment, the movable element 107 comprises aluminum about 10,000 Å thick. Non-metal materials and materials having various properties (e.g., other thicknesses) may be used in some other embodiments. In one embodiment, the movable element 107 comprises nickel and is about 1000 Å thick, for example. In another embodiment, the movable element 107 comprises a bilayer of nickel alloy. In other embodiments, the movable element 107 may comprise a non-metal material or may have other properties (e.g., other thicknesses). For example, the movable element 107 may comprise a dielectric material (e.g., $SiO_2$, SiON, $SiO_xN_y$, $SiN_x$, $SiO_x$, etc.). In certain embodiments, the movable element 107 may range from about 500 Å thick to about 10,000 Å. In certain embodiments, the movable element 107 may be less than 500 Å thick or greater than 10,000 Å thick. In addition, the movable element 107 may have a tensile stress ranging up to 1000 MPa, for example. In some embodiments, the reflective surface 108 of the movable element 107 comprises one material, and the remainder of the movable element 107 comprises a different material. For example, the reflective surface 108 may form the underside of a reflective layer 109. The reflective layer 109 may comprise a metal (e.g., aluminum, an aluminum alloy, aluminum-nickel, chromium, molybdenum-chromium (MoCr), silver, gold, or some other metal or combination of metals) on the underside of the movable element 107, and the remainder of the movable element 107 comprises some other material (e.g., a dielectric), or another type of metal. In one embodiment, the movable element comprises a dielectric or a pure dielectric, such as $ZrO_2$ or a $ZrO_2$ based material.

Figure 11A:
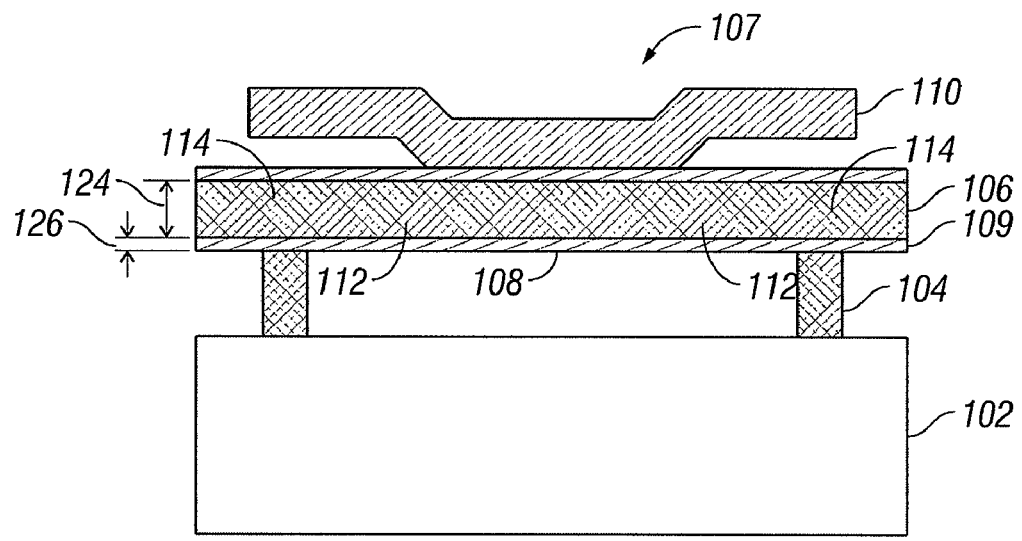
FIG. 11A schematically illustrates another example device in accordance with certain embodiments described herein.
Figure 11B:
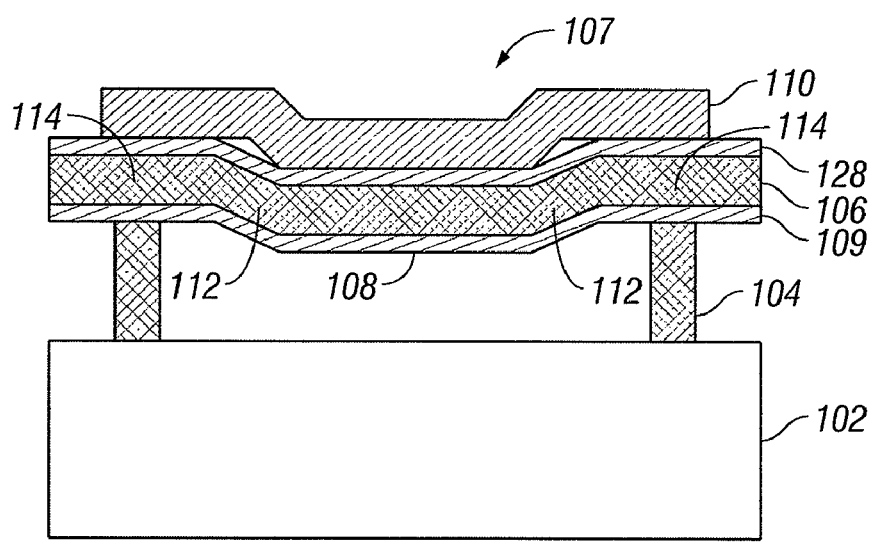
FIG. 11B schematically illustrates the device of FIG. 11A in an actuated state in accordance with certain embodiments described herein.

FIGS. 11A-11B schematically illustrate another example device 100 including a movable stop element 110 in unactuated and actuated states, respectively, in accordance with certain embodiments described herein. As with the device 100 of FIGS. 10A and 10B, and unlike the devices of FIGS. 7C-7E, the optical and mechanical aspects of the movable element 107 are coupled. For example, the portions of the device 100 which contribute to the optical properties of the device 100 (e.g., the reflective layer 109 and/or reflective surface 108) also contribute to the mechanical properties of the device 100 (e.g., the mechanical layer 106 comprising the reflective layer 109 and/or the reflective surface 108). In certain embodiments, the reflective layer 109 is generally attached to and coextensive with the mechanical layer 106. In contrast, as described herein, the optical properties of the devices of FIGS. 7C-7E (e.g., of the reflective layer 14) are generally decoupled from the mechanical properties of the device (e.g., of the deformable layer 34). For example, the reflective layer 14 is generally suspended from the deformable layer 34.

In addition, as indicated by the cross-hatching in FIGS. 11A and 11B, the mechanical layer 106 and the support posts 104 of the device 100 may comprise materials having the same or substantially similar coefficients of thermal expansion (CTEs). In certain embodiments, for example, the mechanical layer 106 and the support posts 104 comprise the same material. In other embodiments, the mechanical layer 106 and the support posts 104 comprise different materials having the same or substantially similar CTEs. In one embodiment, the mechanical layer 106 and the support posts 104 comprise dielectric materials (e.g., $SiO_xN_y$, $SiN_x$, $SiO_x$) having similar CTEs. In an embodiment, the mechanical layer 106 and the support posts 104 comprise SiON. Using dielectric materials for the mechanical layer 106 and the support posts 104 may reduce potential electrical noise issues and may also enable improved control of uniformity on a large glass substrate in manufacturing as chemical vapor deposition (CVD) processes are more controllable for stress in general than physical vapor deposition (PVD) processes. For example, the use of dielectric materials may simplify signal routing and/or reduce the need for electrical shielding. In other embodiments, the mechanical layer 106 and the support posts 104 may comprise other materials described herein (e.g., with respect to FIGS. 10A and 10B). For example, in one embodiment, the mechanical layer 106 comprises a bilayer of nickel alloy and the support posts comprise nickel alloy or some other material with a CTE similar to that of nickel alloy. In certain embodiments, the support posts 104 are generally resistant to the release etch process in which the sacrificial layer is removed from between the reflective layer 109 and the substrate 102. For example, the support structure 104 may be generally resistant to $XeF_2$ which may be used to remove a Molybdenum sacrificial layer.

The architecture of the device 100 of FIG. 11A can provide a number of advantages. For example, such an architecture can lead to a reduction in the effect of temperature changes on the deformation of the device 100, improving the optical performance of the device 100. This reduction may be in part due to the matching of the CTEs between the mechanical layer 106 and the support posts 104. The matching of the CTEs between the mechanical layer 106 and the support posts 104 may generally improve the shape (e.g., planarity) of the reflective layer and/or reflective surface 108 (e.g., during actuation and/or release etch).

The mechanical layer 106 and the support posts 104 may not be in contact with one another in certain embodiments. For example, the reflective layer 109, which may comprise a material having a different CTE (e.g., aluminum) than the mechanical layer 106 and the support posts 104 can be positioned between the mechanical layer 106 and the support posts 104. In certain embodiments, mechanical layer 106 has a thickness 124 more than about ten times as large as the thickness 126 of the reflective layer 109. In some embodiments, mechanical layer 106 has a thickness 124 more than about twice as large as the thickness 126 of the reflective layer 109. In general, the stress exerted by the various layers on adjacent layers when temperature changes due to mismatched CTEs is proportional to the thickness of the layer. For example, relatively thin layers may generally exert less stress on adjacent layers than relatively thick layers. Accordingly, in certain embodiments, the stress exerted on the mechanical layer 106 by a relatively thin reflective layer 109 between the mechanical layer 106 and the support posts 104 is small enough to be generally negligible, particularly in comparison to the stress that is exerted on the mechanical layer 106 if the support posts 104 and the mechanical layer 106 did not have CTEs which were matched to each other. In certain other embodiments, the mechanical layer 106 and the support posts 104 are in direct contact. For example, the reflective layer 109 may not extend over the support posts 104 in certain embodiments, and the mechanical layer 106 may be in direct contact with the support posts 104 or portions thereof.

In some embodiments, the device 100 may include an upper layer 128 comprising a material having the same or substantially the same CTE as does the reflective layer 109. The upper layer 128 may counter any forces or stress that the reflective layer 109 may exert on the mechanical layer 106. In some embodiments, the matching of the CTEs of the mechanical layer 106 and the support posts 104 may be characterized as first-tier, or primary CTE balancing, while the matching of the matching of the CTEs of the reflective layer 109 and the upper layer 128 may be characterized as second-tier, or supplementary CTE balancing.

Figure 12A:
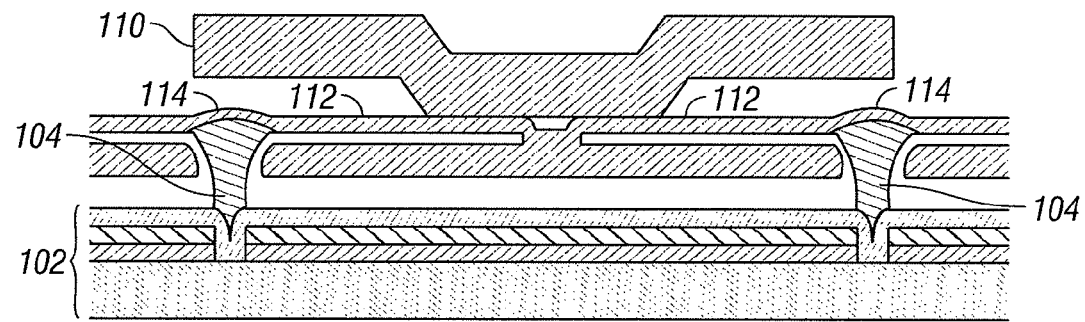
FIG. 12A schematically illustrates another example device in accordance with certain embodiments described herein.
Figure 12B:
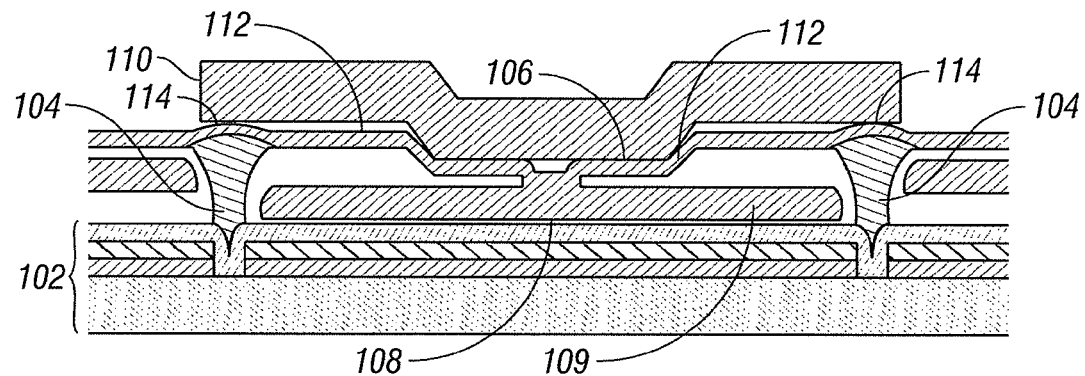
FIG. 12B schematically illustrates the device of FIG. 12A in an actuated state in accordance with certain embodiments described herein.

FIGS. 12A-12B schematically illustrate another example device 100 including a movable stop element 110 in unactuated and actuated states, respectively, in accordance with certain embodiments described herein. As shown, the device 100 architecture is similar to the devices of FIGS. 7C-7E and the optical properties of the device 100 (e.g., of the reflective layer 109 and/or the reflective surface 108) are decoupled from the mechanical properties of the device 100 (e.g., of the mechanical layer 106).

Figure 13A:
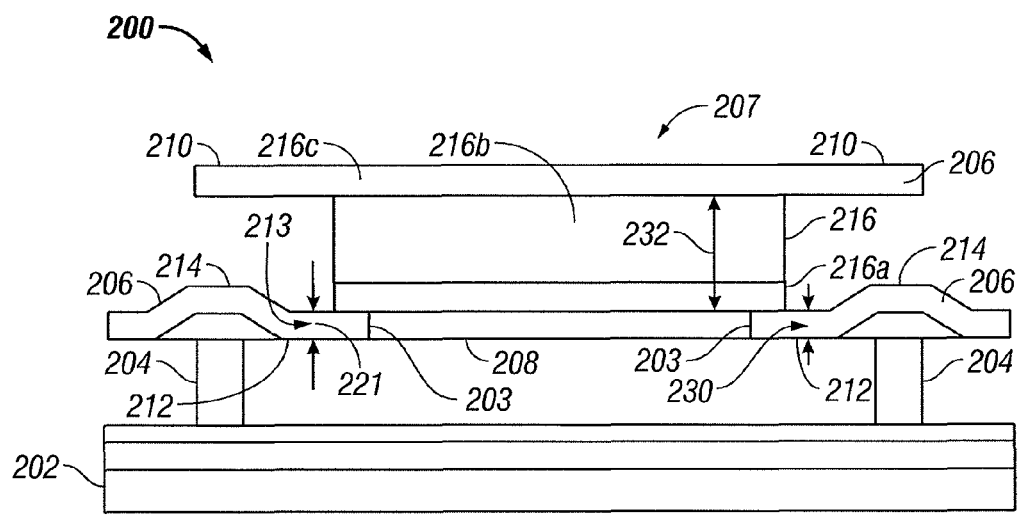
FIG. 13A schematically illustrates another example device in accordance with certain embodiments described herein.
Figure 13B:
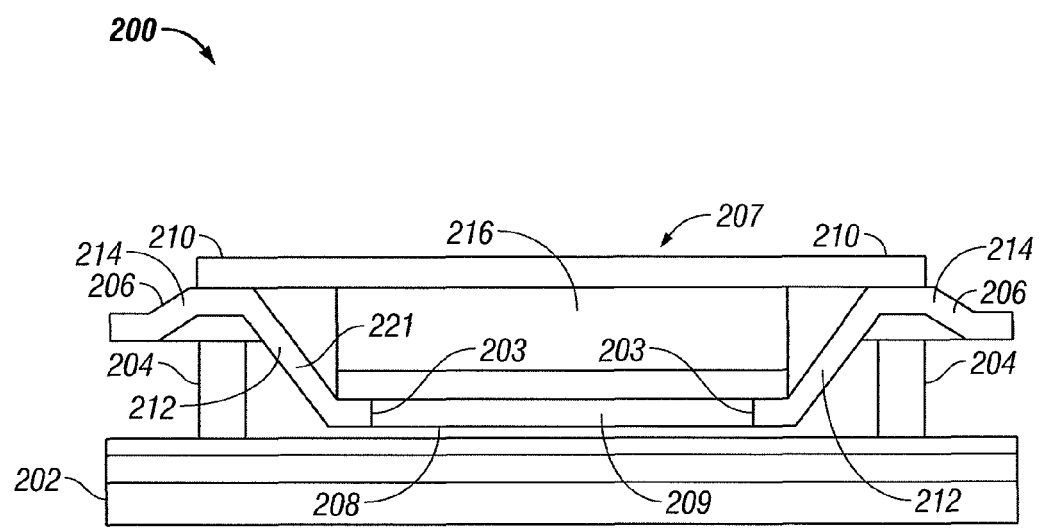
FIG. 13B schematically illustrates the device of FIG. 13A in an actuated state in accordance with certain embodiments described herein.

FIGS. 13A-13B schematically illustrate another example device 200 in unactuated and actuated states, respectively, in accordance with certain embodiments described herein. The device 200 includes a substrate 202 and a plurality of supports 204 over the substrate 202. The device 200 further comprises a reflective surface 208 and a mechanical layer 206 comprising a movable portion 212 and a stationary portion 214. In certain embodiments, the device 200 may include a movable stop element 210. In some embodiments, the substrate 202, the plurality of supports 204, the mechanical layer 206, the reflective surface 208, and the movable stop element 210 may be generally similar to and arranged in a manner similar to the substrate 102, the plurality of supports 104, the mechanical layer 106, the reflective surface 108, and the movable stop element 110 described above (e.g., with respect to FIGS. 8-10). As shown, the stop element 210 may be at least partially laterally displaced from the reflective surface 208 (e.g., the displacement of the stop element 210 relative to the reflective surface 208 has a non-zero component in a direction generally parallel to the substrate 202).

In certain embodiments, the movable portion 212 has a first thickness 230, the stationary portion 214 is disposed over the supports 204, and the device 200 further comprises a movable element 207 positioned over the substrate 202. The movable element 207 may be mechanically coupled to the movable portion 212 and comprise the reflective surface 208. The reflective surface 208 may form the underside of a reflective layer 209. The reflective layer 209 may comprise a metal (e.g., aluminum, an aluminum alloy, aluminum-nickel, chromium, molybdenum-chromium (MoCr), silver, gold, or some other metal or combination of metals) on the underside of the movable element 207, and the remainder of the movable element 107 comprises some other material (e.g., a dielectric), or another type of metal.

In certain embodiments, the movable element 207 further comprises a stiffener portion 216 positioned above the movable portion 212 and positioned above and mechanically coupled to the reflective surface 208. For example, as shown in FIGS. 13A-13B, a portion of the stiffener portion 216 may be in direct contact with the reflective surface 208 and another portion of the stiffener portion 216 extends over and is in direct contact with the movable portion 212 of the mechanical layer 206. In other embodiments, the stiffener portion 216 may be mechanically coupled to the reflective surface 208 in other ways. For example, in some cases, the stiffener portion 216 may not extend over a portion of the mechanical layer 206 or otherwise directly contact the mechanical layer 206, and instead only directly contacts the reflective surface 208. In other embodiments, the mechanical layer 206 may extend over substantially the entire area of the reflective surface 208 (e.g., as in FIG. 10 and FIG. 11). In such configurations, the stiffener portion 216 may be in direct contact with and generally sit on top of the mechanical layer 206. The stiffener portion 216 is thus mechanically coupled to the reflective surface 208 via the mechanical layer 206 while not directly contacting the reflective surface 208. The stiffener portion 216 may extend along a substantial fraction of the area of the reflective surface 208. For example, the stiffener portion 216 of certain embodiments extends along more than half of the area of the reflective surface 208. In some embodiments, such as in the illustrated embodiment of FIGS. 13A and 13B, the stiffener portion 216 may extend along substantially the entire area of the reflective surface 208. In other configurations, the stiffener portion 216 may extend along some other substantial fraction of the area of the reflective surface 208 which is less than half of the area of the reflective surface 208. The area of the reflective surface 208 may be defined by the two-dimensional surface area of the reflective surface 208. The area of the reflective surface 208 may correspond to the area of a pixel which contributes to its optical properties, for example.

In certain embodiments, the plurality of supports 204 and the mechanical layer 206 comprise materials having substantially similar coefficients of thermal expansion (CTE) in a manner similar to the plurality of supports 104 and the mechanical layer 106 described herein (e.g., with respect to FIGS. 10A-10B). In some embodiments, the stiffener portion 216, the mechanical layer 206, and the plurality of supports 204 comprise materials (e.g., dielectric materials) having substantially similar CTEs. Such CTE matching can reduce the effect of temperature changes on the deformation of the device 200, improving the optical performance of the device 200. The matching of the CTEs may generally improve the shape (e.g., planarity) of the reflective layer 209 and/or surface 208 (e.g., during actuation and/or release etch).

The stiffener portion 216 is configured to stiffen the reflective layer 209 and/or surface 208 (e.g., to inhibit bending of the reflective layer 209 and/or surface 208). For example, the stiffener portion 216 may be rigid or substantially rigid. The stiffener portion 216 may be relatively thick in certain embodiments, thereby improving the shape (e.g., planarity of the reflective layer 209 and/or surface 208 (e.g., during release etch or actuation). For example, the stiffener portion 216 of certain embodiments has a second thickness 232 which is greater than the first thickness 230 of the movable portion 212. While not shown with respect to FIG. 13A, in certain embodiments the second thickness 232 can additionally include the thickness of the stop element 210.

The stiffener portion 216 of certain embodiments may be positioned between the movable portion 212 and the at least one stop element 210, for example. While FIGS. 13A-13B show a stop element 210 positioned on top of the stiffener layer 216, the positioning of the stop element 210 may differ in alternative configurations. For example, the stop element 210 may be positioned between one or more portions of the device 200. In one embodiment, the stop element 210 is positioned in the middle of the stiffener portion 216 or in between one or more segments 216a, 216b, 216c of the stiffener portion 216. In some embodiments, the device 200 does not include a stiffener portion 216, and the stop element 210 is coupled to the mechanical layer 206 and suspended above the stationary portions 214 of the mechanical layer 206 in some other manner. For example, one or more supporting structures instead of the stiffener portion 216 may be positioned between the stop element 210 and the movable portion 212. In some embodiments, the device 200 does not include one or more of the stop element 210 and the stiffener portion 216.

Referring still to FIGS. 13A-13B, the stiffener portion 216 of certain embodiments comprises a bottom segment 216a, a middle segment 216b, and a top segment 216c. As used herein, the term "bottom segment" refers to the segment closest to the mechanical layer and the term "top segment" refers to the segment farthest from the mechanical layer. In certain embodiments, bottom segment 216a may comprise a metal (e.g., nickel), the middle segment 216b may comprise an oxide (e.g., $SiO_2$), and the top segment 216c may comprise a metal (e.g., nickel). In various alternative configurations, the bottom, dielectric, and top segments 216a, 216b, 216c comprise other materials. For example, the middle segment 216b may comprise $AlO_x$, $SiN_x$, or $SiO_xN_y$ in various embodiments. In some embodiments, the middle segment 216b comprises a metal (e.g., nickel). In alternative configurations, the bottom segment 216a and/or top segments 216c may comprise an oxide, some other dielectric, or some other material or combination of materials (e.g., an alloy) and the dielectric segment 216b may comprise some other material, or some other combination of materials. In certain other embodiments, the stiffener portion 216 comprises one integral piece, may comprise two segments, or may comprise more than three segments. The stop element 210 may form a part of the stiffener portion 216 in certain embodiments. For example, in the embodiment of FIGS. 13A-13B, the stop element 210 forms a part of the top segment 216c of the stiffener portion 216.

The stiffener portion 216 may provide improved device performance (e.g., optical performance). For example, the stiffener portion 216 may increase the stiffness and/or flatness of the reflective layer 209 and/or reflective surface 208 which improves the optical performance of the device 200. As such, the stiffener portion 216 may help increase the stiffness of the reflective layer 209 and/or reflective surface 208 which can help to avoid relaxation (which may also referred to as "launch" or "sag") of the mirror or reflective surface 208 when the sacrificial layer is removed during the manufacture of the device 200. The stiffener portion 216 may additionally help increase the stiffness of the reflective layer 209 and/or reflective surface 208 during actuation of the device 200 instead of, or in addition to, during launch. The middle segment 216b of the stiffener portion 216 may have a different CTE than one or more of the bottom segment 216a and the top segment 216c (e.g., because the middle segment 216b may comprise a different material than one or more of the bottom segment 216a and the top segment 216c). The thicknesses of the bottom segment 216a and the top segment 216c may be sufficiently thinner than the middle segment 216b such that the forces due to mismatched materials do not substantially affect the shape of the middle segment 216b, and thus advantageously do not substantially affect the shape (e.g., planarity) of the reflective layer 209 and/or reflective surface 208. In certain embodiments, the stresses applied to the middle segment 216b by the top segment 216c and the stresses applied to the middle segment 216b by the bottom segment 216a are substantially equal.

As shown in FIGS. 13A-13B, the optical and mechanical aspects of the movable element 207 of the device 200 reside in the same horizontal plane. For example, the portions of the movable element 207 which contribute to the optical properties of the device (e.g., the reflective layer 209 and the reflective surface 208) and the portions of the movable element 207 which contribute to the mechanical properties of the device 200 (e.g., the mechanical layer 206) reside in the same horizontal plane. For example, the reflective layer 209 extends in the same horizontal plane as the mechanical layer 206 across the device 200 between the ends 203 of the stationary portion 214 which are joined to the reflective layer 209. In addition, the optical and mechanical aspects of the movable element 207 are decoupled. For example, the portions of the movable element 207 which contribute to the optical properties of the device 200 (e.g., the reflective layer 209 and the reflective surface 208) do not contribute to the mechanical properties of the device 200. For example, the mechanical layer 206 and the reflective layer 209 comprise discrete elements (e.g., comprising different materials). The mechanical layer 206 of certain embodiments may terminate at the ends 203 of the stationary portion 214 which are joined to the reflective layer 209. Devices 200 according to this architecture may be characterized as having an in-plane decoupled device architecture. In-plane decoupled devices comprise devices in which the mechanical and optical aspects of the device 200 reside in the same horizontal plane and are decoupled from one another.

In addition, the mechanical layer 206 and the reflective layer 209 of certain embodiments may be configured differently in relation to each other and still be characterized as in-plane decoupled. For example, the mechanical layer 206 may be at least partially positioned underneath the reflective layer 209 or above or on top of the reflective layer 209 in certain embodiments and still be characterized as in-plane decoupled. For example, in one embodiment the reflective layer 209 is positioned on top of and overlaps with a portion of the stationary portion 214 instead of being attached to one or more ends 203 of the stationary portion 214 as shown in FIGS. 13A-13B. In another embodiment, the reflective layer 209 is attached to the underside of the mechanical layer 206 and thus overlaps with a portion of the stationary portion 214 of the mechanical layer 206 instead of being attached to the one or more ends 203 of the stationary portion 214.

Figure 14A:
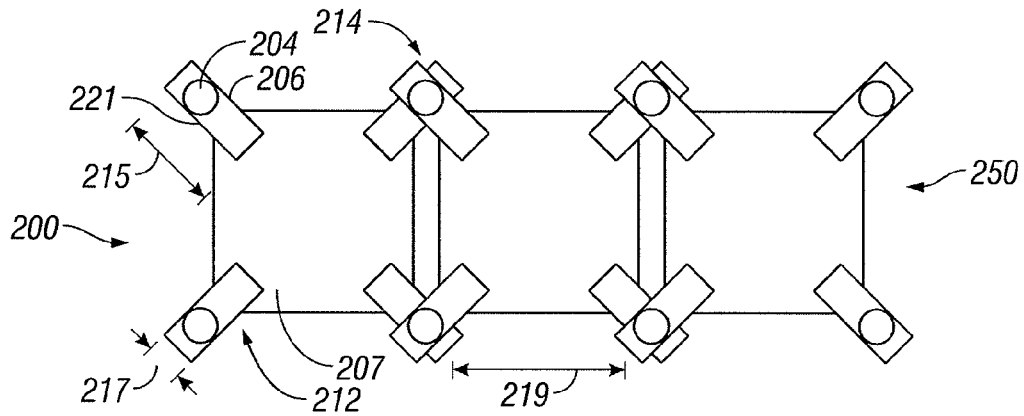
FIGS. 14A-14C each schematically illustrate the mechanical layers and the movable elements of a row of three interferometric devices in accordance with certain embodiments described herein.

FIG. 14A schematically illustrates the mechanical layers 206 and the movable elements 207 of a row 250 of three interferometric devices 200 in accordance with certain embodiments described herein. As shown, the movable portions 212 of the mechanical layer 206 of certain embodiments comprise one or more tethers 221 coupled to and extending from the stationary portion 214. The tethers 221 are further coupled to the reflective layer 209. Referring to FIGS. 13A-13B and FIGS. 14A-14C, the materials selected for the tethers 221 and/or properties (e.g., thicknesses 213, lengths 215, and widths 217) of the tethers 221 may be selected so as to optimize certain characteristics of the device 200. As shown in FIGS. 13A-13B, the thickness 213 of a tether 221 may correspond to the distance from the bottom of the tether 221 to the top of the tether 221. In certain embodiments, the thickness of the tether 221 corresponds to the thickness of the movable portion 212 of the mechanical layer 206. Referring again to FIGS. 14A-14C, the length 215 of a tether 221 may correspond to the distance from one end of the tether 221 (e.g., the end coupled to the stationary portion 214) to the other end of the tether 221 (e.g., the point at which a tether 221 joins with or couples to the reflective layer 209 of the movable element). The width 217 of a tether 221 comprises the distance from one elongate side of the tether 221 to the other elongate side of the tether 221. The materials and/or properties may be selected so as to reduce the effects of "launch" that may occur when a sacrificial layer is removed during the manufacture of the device 200. Launch may occur, for example, when the optical stack including the reflective layer 209 and/or reflective surface 208 sags towards the substrate in the relaxed state. Relatively large thicknesses 217 and/or widths 213 may correspond to reduced launch, for example.

Figure 14B:
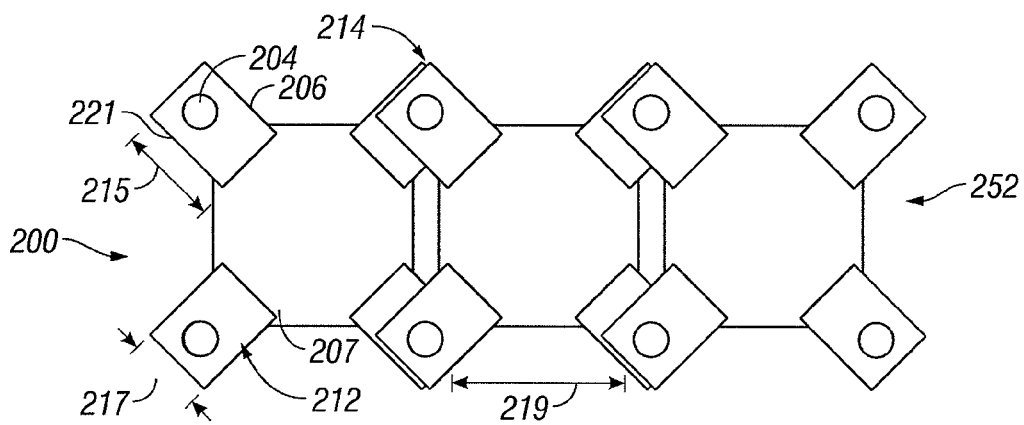
Figure 14C:
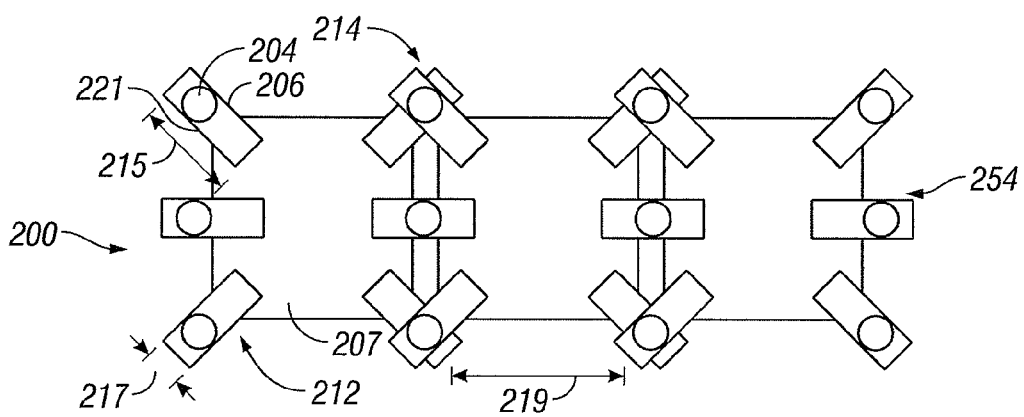

In addition, the device 200 may comprise relatively thin tethers 221, relatively narrow, and/or relatively long tethers when a low actuation voltage is desired. The device 200 may comprise relatively thick, relatively wide, or relatively short tethers 221 when a higher actuation voltage is desired. FIG. 14B, for example, shows a row 252 of devices 200 including tethers 221 that are relatively thicker than the tethers 221 of FIG. 14A. Different numbers of tethers 221 may be included in some configurations. For example, a small number of tethers 221 may be used when a low actuation voltage is desired. A relatively large number of tethers 221 may be used to reduce the effects of "launch." For example, FIG. 14C shows a row 254 of devices 200 wherein six tethers 221 are attached to each device 200. In alternative configurations, a fewer number or a greater number of tethers 221 may be used and/or tethers 221 of different thicknesses may be used. In certain embodiments, the dimensions and materials of the tethers 221 may be dependent on the pixel size and/or actuation voltage of the device 200. In certain embodiments, one or more of the dimensions of the tethers 221 may range from the minimum device resolution of the manufacturing process up to some other value. For example, the width 213 of the tethers 221 may range from the minimum device resolution up to a fraction of the width 219 of the reflective layer 209 or reflective surface 208. In certain embodiments, the material of the tether 221 may be selected to reduce launch. For example, the materials may be selected so as to balance the internal stresses of the tethers 221.

A variety of other configurations of the tethers 221 are possible. For example, in certain embodiments, different tethers 221 of the same device 200 may comprise varying widths 213, lengths 215, or thicknesses 217. Each tether 221 may comprise a non-uniform width 213 or thickness 217 in some embodiments. Although not shown with respect to FIGS. 14A-14C for the purposes of illustration, the interferometric devices 200 may include any or all of the components of the device 200 described herein. For example, the devices 200 of FIGS. 14A-14C may each include one or more stop elements 210 and/or stiffener portions 216. In other embodiments, the movable portion 212 comprises some other shape instead of one or more tethers 221.

In other configurations, the reflective layer 209 and the mechanical layer 206 may be in plane with one another or may be out of plane with one another. For example, in the configuration shown by FIG. 7A, the strip of metal material 14 may comprise both a reflective surface (or optical layer) and a mechanical layer (e.g., the strip of metal material 14 may comprise one layer having both mechanical and optical properties). The reflective layer and the mechanical layer of the device of FIG. 7A are substantially in plane with one another and the mechanical and optical functionalities both reside in the strip of metal material 14, so the corresponding device architecture may be characterized as "in-plane coupled". As discussed above, in FIG. 7C and FIG. 7D, the movable reflective layer 14 is suspended from a mechanical layer 34. As such, the reflective layer 14 resides in a different horizontal plane than does the mechanical layer 34 and the mechanical and optical properties reside in the reflective layer 14 and the mechanical layer 34 respectively. The reflective layer 14 and mechanical layer 34 of this device are substantially out of plane with one another and the optical and mechanical functionalities are in separate portions, so the corresponding device architecture may be characterized as "out-of-plane decoupled."

As discussed, the device 200 of FIGS. 13A-13B has an in-plane decoupled architecture. FIGS. 14A-14C, 13, 16A, 16, and 17 also show examples of devices having such an architecture, and other configurations are possible as well. An in-plane decoupled architecture (e.g., where the mechanical layer 106 comprises one or more tethers 221) provides a number of advantages. For example, as discussed, the reflective layer 209 may comprise a different or separate component from the mechanical layer 206. As such, the reflective layer 209 may be selected from a set of materials which does not include certain mechanical properties associated with mechanical portions of the device 200 (e.g., the mechanical layer 206). Likewise, the mechanical layer 206 may be selected from a set of materials which does not include certain optical properties associated with optical portions of the device 200 (e.g., the reflective layer 209 and/or reflective surface 208). As such, the material used to construct the movable element 207 and portions thereof (e.g., the reflective layer 209 and/or the reflective surface 208) and/or the mechanical layer 206 can be selected from a relatively large set of materials. For example, as discussed above, the mechanical layer 206 may comprise nickel, nickel alloy, aluminum-nickel, aluminum alloy, aluminum, some other metal, some other alloy, or some other combination of metals. The movable element 207 or portions thereof (e.g., the reflective layer 209 and/or reflective surface 208) of certain embodiments comprise aluminum, an aluminum alloy, aluminum-nickel, or some other metal or combination of metals. In one embodiment, the reflective surface 208 comprises a surface of the movable element 207 comprising aluminum and being about 10,000 Å thick. Non-metal materials and materials having various properties (e.g., other thicknesses) may be used in some other embodiments. In certain embodiments where the mechanical layer 206 comprises tethers 221, the mechanical layer 206 and the reflective layer 209 of an in-plane decoupled device 200 may comprise the same material. In such embodiments, the optical and mechanical properties of the device can be decoupled. For example, the tethers 221 can be patterned as described herein (e.g., by changing the widths 217, lengths 215, and/or thicknesses 213) so as to affect the mechanical properties of the device 200 without substantially affecting the optical properties of the device 200. In such embodiments, the tethers 221 may be characterized as forming a part of the reflective layer 209.

Figure 15:
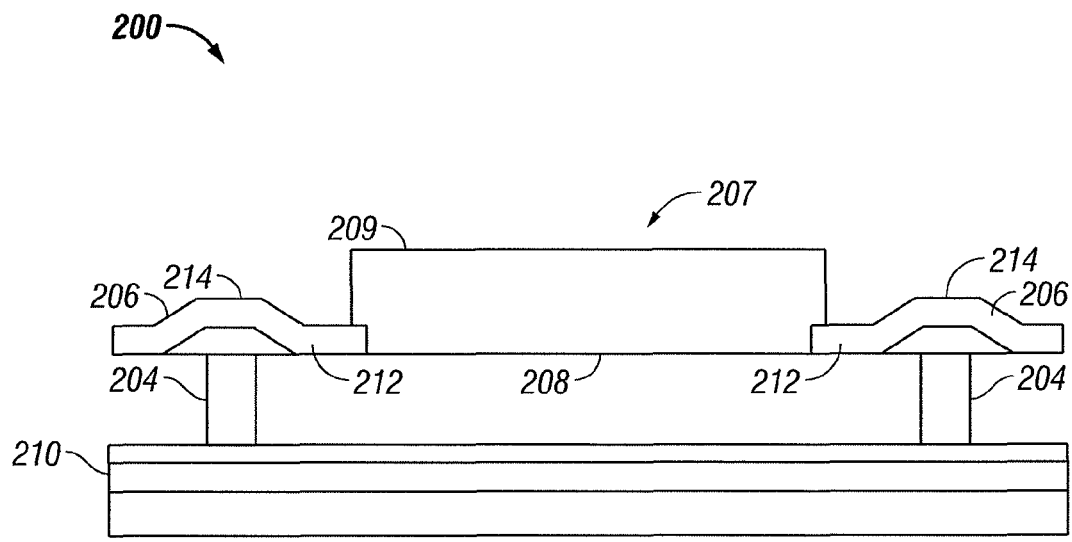
FIG. 15 shows an example device including a relatively thick reflective surface in accordance with certain embodiments described herein.

In addition, the device 200 having an in-plane decoupled device architecture may comprise a movable element 207 and mechanical layer 206 having a wide variety of dimensions and/or other properties. For example, the device 200 may comprise a relatively thick moveable element 207 in certain embodiments because of the in-plane decoupled device architecture. FIG. 15 shows an example device 200 including a relatively thick movable element 207. In some embodiments, the movable element 207 may be from about 20 to about 30 times thicker than the mechanical layer 206. In certain other embodiments, the movable element 207 may be from about 2 to about 100 times thicker than the mechanical layer 206. In one embodiment, the movable element 207 is 10,000 Å thick and the mechanical layer is 1000 Å thick. A relatively thick movable element 207 may provide improved optical performance (e.g., by increasing the flatness and/or rigidity of the reflective layer 209 and/or surface 208). A relatively thick movable element 207 or a movable element 207 with a stiffener portion 216 may help increase the stiffness of the movable element 207 and thereby increase the stiffness of the reflective layer 209 and/or reflective surface 208, which can help to avoid launch of the movable element 207 when a sacrificial layer is removed during manufacture.

In certain embodiments, the device 200 may comprise a relatively thin mechanical layer. For example, the mechanical layer 206 may comprise a layer of material (e.g., nickel or aluminum alloy) of about 300 Å in one embodiment. In various embodiments, the mechanical layer 206 may be between about 50 and about 500 Å thick. A relatively thin mechanical layer 206 may be less susceptible to fatigue than thicker mechanical layers. Among other reasons, the mechanical layer 206 may be relatively thin because it does not substantially influence the optical characteristics of the device (e.g., it does not include the reflective surface 208), unlike certain devices having an in-plane coupled device architecture (e.g., the device of FIG. 7A). Additionally, in contrast with certain devices having an out-of-plane decoupled device architecture (e.g., the devices of FIGS. 7C and 7D), the mechanical layer 206 may be relatively thin because the reflective layer 209 is not suspended by the mechanical layer 206.

It is generally desirable that the reflective layer 209 stay substantially flat under different temperature conditions and when various portions of the device 200 (e.g., the reflective layer 209, the stiffener portion 216, mechanical layer 206, the support posts 204, or portions thereof) undergo different stress conditions. In certain embodiments, the properties of the movable element 207 may also be selected so as to optimize mirror curvature behavior (e.g. flatness of the reflective layer 209 and/or the remainder of the movable element 207) while reducing cost and complexity relative to other configurations (e.g., relative to the configurations of FIG. 7C-7E). For example, the change in mirror curvature as a function of temperature may be controlled without reducing aperture or substantially increasing cost (e.g., cost associated with increased deposition or other manufacture time, material thickness, etc.) relative to other device architectures. Such improved mirror curvature performance and control may be achieved, for example, by selecting a relatively thick movable element 207 or by selecting a relatively stiff material for the movable element 207, or a portion thereof. For example, a material may be selected which stays flat at a wide range of temperatures and under a variety of stress conditions. Such configurations can cause the movable element 207 and thus the reflective surface 209 to remain substantially flat under a wide range of conditions. In comparison to other configurations, for example, there may be more flexibility in the choice of materials and/or thickness of the movable element 207. This is in contrast to the configurations of FIGS. 7C-7E where a supporting structure 34 is constructed on top of and suspending the mirror 14.

Fabrication of the in-plane decoupled architecture of the device 200 may additionally include fewer steps to construct or may be otherwise less complicated (e.g., the manufacture of the device 200 may involve less mask layers) than fabrication of other architectures while retaining certain advantages of those architectures and/or having other advantages. For example, the in-plane decoupled architecture 200 may include fewer steps to construct than does the decoupled out-of-plane architecture of FIG. 7C-7E. Constructing the device 200 in certain embodiments includes seven mask layers, eight mask layers, or some other number of mask layers.

The device 200 may also provide improved step coverage relative to other configurations such as the configuration of FIGS. 7C-7E. For example, improved step coverage may be achieved through the selection of a relatively thick movable element 207. Such improved step coverage may allow for the formation of a relatively thin mechanical layer 206 as described herein.

The movable element 207 of the device 200 has a specific voltage at which it can actuate and release. This actuation voltage can be related to the dimensional and material properties of the mechanical layer 206. In certain embodiments, the dimensional and/or material properties of devices having an in-plane decoupled architecture can be modified by changing a physical or mechanical aspect of the design without substantially affecting the optical behavior or performance. The in-plane decoupled architecture can thereby provide more flexibility and freedom in modifying the actuation voltage to a desirable value. As such, in certain embodiments, the voltage tunability (e.g., RGB or RSVP voltage matching) of the device 200 having an in-plane decoupled architecture is improved with respect to other architectures, such as, for example, in-plane coupled device architectures. For example, for devices having one or more tethers 221, mechanical stiffness can be modified by adjusting tether properties such as width and thickness, thereby adjusting the actuation voltage without substantially affecting optical performance. The voltage tunability of some embodiments may be relatively similar to devices having other device architectures, such as, for example, the out-of-plane decoupled architecture.

The scalability to higher display resolutions and range of achievable display color depths may also be improved for devices 200 having an in-plane decoupled architecture as compared to some other device architectures, such as, for example, in-plane coupled device architectures. This improved scalability may be due to the relatively high aperture ratios (discussed more fully with respect to FIGS. 16A-16C below) associated with the in-plane decoupled architecture which may be achieved due to the decoupling of the mechanical layer from the optical layer. In contrast, the aperture ratio of devices having an in-plane coupled device architecture may be reduced due to the coupling of the optical and mechanical layers. For example, the aperture ratio of an in-plane coupled device architecture may be reduced due to loss of optically active area in regions of the device in proximity to the edges, rails, or posts and in regions of the device which may bend during actuation. In addition, the scalability and achievable color depth of the in-plane decoupled device architecture may be relatively similar to devices having other device architectures, such as, for example, the out-of-plane decoupled device architecture.

Devices 200 having an in-plane decoupled device architecture may exhibit a relatively large hysteresis window as compared to devices having other device architectures, such as, for example, devices having an in-plane coupled device architecture. The larger hysteresis window may be due to the decoupling of the mechanical layer 206 and the reflective layer 209 which allows the reflective layer 209 to move and otherwise generally behave as a rigid body. The hysteresis window exhibited by devices having an in-plane decoupled device architecture may also be relatively similar to devices having certain other device architectures, such as, for example, the out-of-plane decoupled architecture.

The in-plane decoupled device architecture may allow for increased flexibility in designing more reliable and/or lower cost devices 200 in certain embodiments. In certain embodiments, the in-plane decoupled device architecture may thus be characterized as having a relatively improved reliability and/or cost mitigation space as compared to certain other device architectures. For example, in-plane decoupled architecture may have an improved reliability and/or cost mitigation space as compared to the out-of-plane decoupled device architecture due at least in part to the available flexibility in creating a relatively thin mechanically layer 206, and/or multi-stack or otherwise relatively thick optical layer (e.g., reflective layer 209 and/or reflective surface 208) as described herein. Additionally, the number of masks involved in constructing in-plane decoupled devices may be less than devices having other device architectures (e.g., out-of-plane decoupled architectures) thereby improving the reliability and/or cost mitigation space.

Figure 16A:
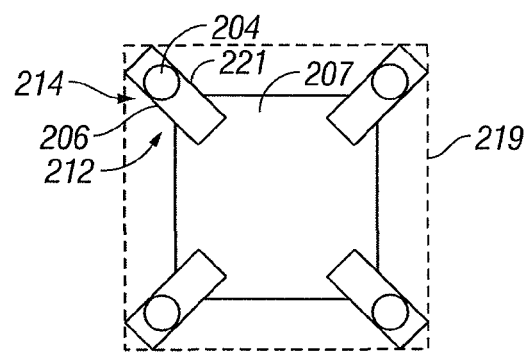
FIG. 16A schematically illustrates the mechanical layer and the movable element of an interferometric device having an in-plane decoupled device architecture in accordance with certain embodiments described herein.
Figure 16B:
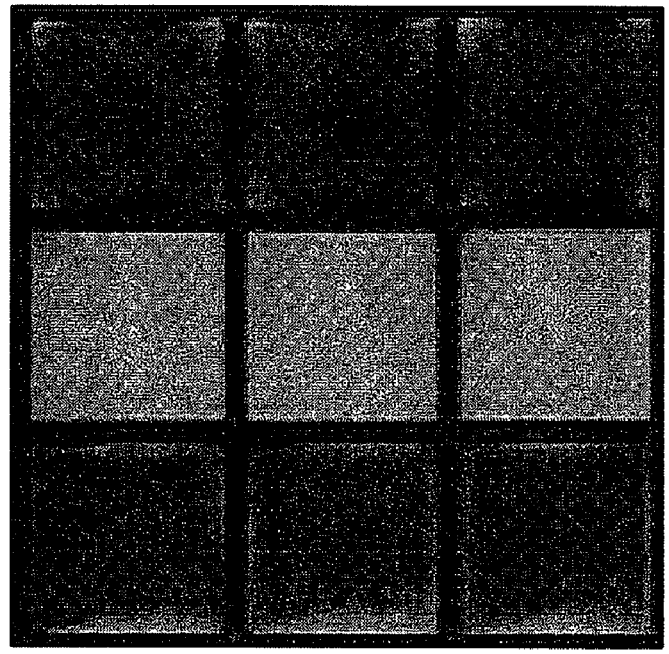
FIG. 16B schematically illustrates a top view of interferometric devices 120 having an out-of-plane decoupled device architecture.
Figure 16C:
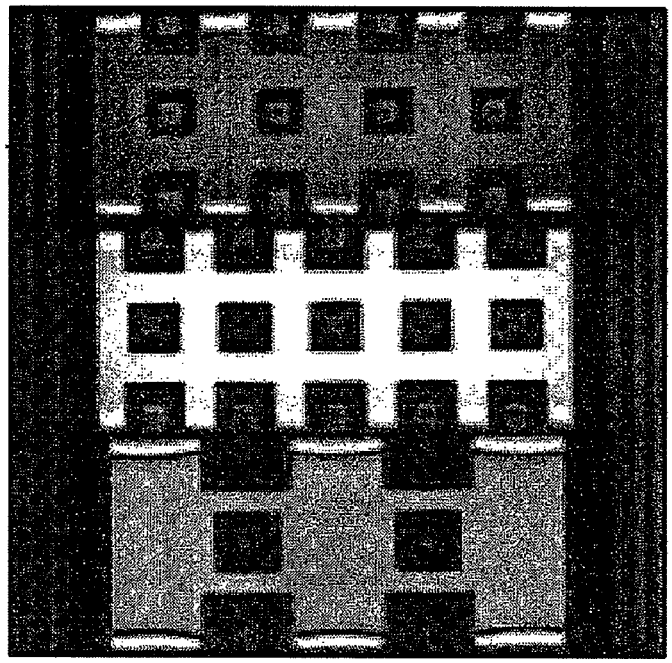
FIG. 16C schematically illustrates a top view of interferometric devices 130 having in-plane coupled device architecture.

FIG. 16A schematically illustrates the mechanical layer 206 and movable element 207 of an interferometric device 200 having an in-plane decoupled device architecture in accordance with certain embodiments described herein. An aperture ratio of the device 200 may correspond to the ratio of the area defined by the movable element 207 to the area defined by the dotted line 219 which generally corresponds to the perimeter of the device 200. The aperture ratio may define what portion of the device 200 is optically active, and an increased aperture ratio may thus generally correspond to improved optical performance. A measure of the aperture ratio may also take into account critical dimension loss. For example, critical dimension loss can correspond to a portion of the reflective surface 208 which is not optically active, such as a portion of the outer perimeter of the reflective surface 208. The amount of critical dimension loss may be defined by an amount of each edge of the reflective surface 208 which is not optically active. FIG. 16B schematically illustrates a top view of interferometric devices 220 having an out-of-plane decoupled device architecture. FIG. 16C schematically illustrates a top view of interferometric devices 230 having in-plane coupled device architecture.

Figure 17:
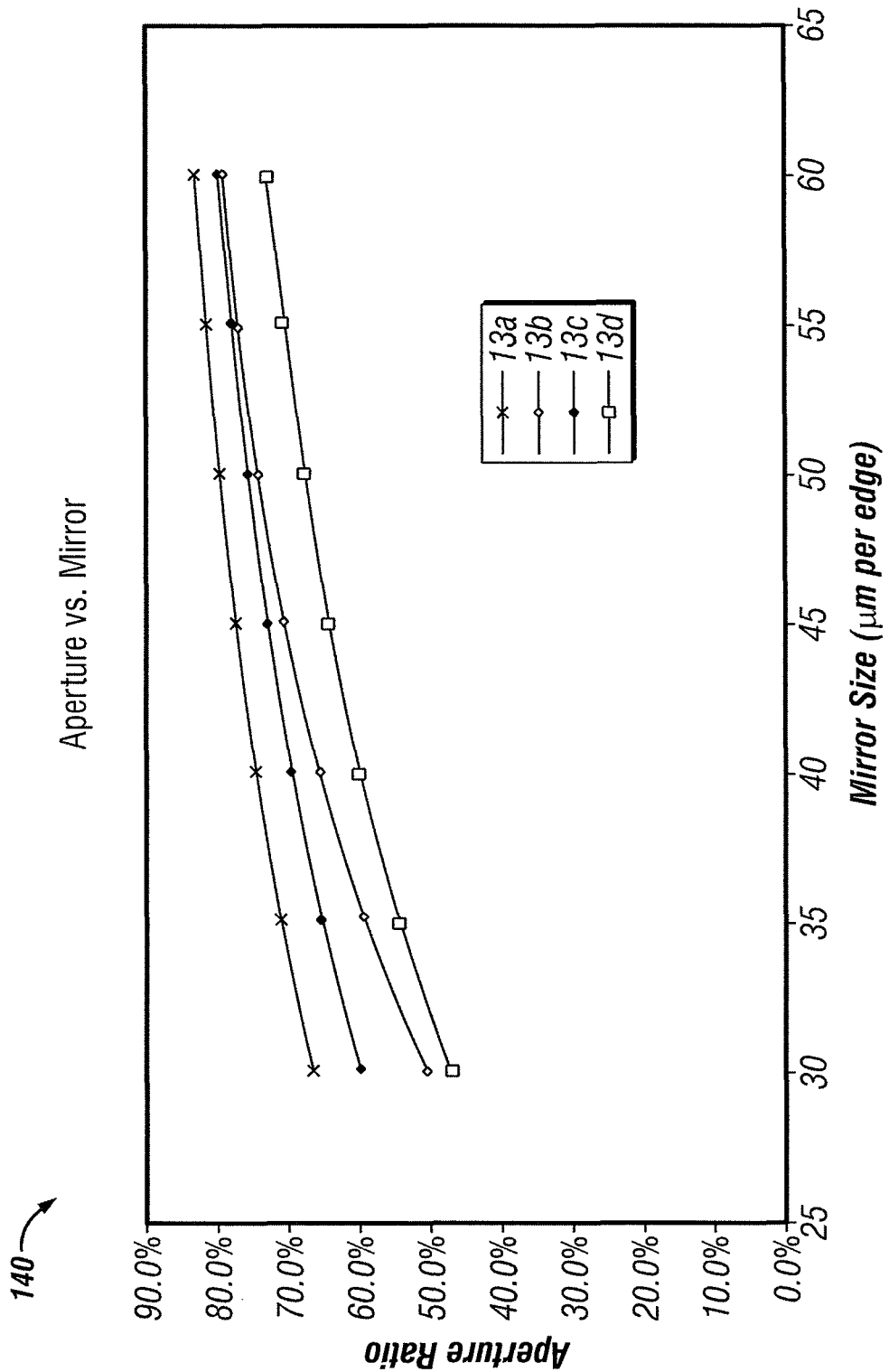
FIG. 17 illustrates a chart showing the aperture ratio versus mirror size of two devices having an in-plane decoupled device architecture and of two devices having an out-of-plane decoupled device architecture.

The aperture ratio of certain embodiments of the in-plane decoupled device 200 may be greater than or generally comparable to certain other device architectures while retaining certain advantages and/or not including certain disadvantages of those device architectures. For example, the in-plane decoupled devices 200 of FIG. 16A may comprise a larger aperture ratio than the in-plane coupled devices 230 of FIG. 16C. FIG. 17 illustrates a chart showing aperture ratio versus reflective surface size of two example devices 200 having an in-plane decoupled device architecture in accordance with certain embodiments described herein and two example devices 220 having an out-of-plane decoupled device architecture. Each of the example devices 200, 220 comprises a square reflective surface and the horizontal axis of FIG. 17 indicates the length in micrometers per edge of the reflective surface. In addition, the example devices 200, 220 were simulated using four micrometer design rules. Plot 13a shows the aperture ratio as a function of mirror size for an example in-plane decoupled device 200 having tethers which form a part of the reflective layer 209, and plot 13b shows the aperture ratio as a function of mirror size for an example in-plane decoupled device 200 having tethers 221 which do not form a part of the reflective layer 209. The example devices 200 of plots 13a and 13b comprise critical dimension loss of about 0.5 micrometers per edge. Plots 13c and 13d show the aperture ratios of two example out-of-plane decoupled devices 220 having one micrometer and two micrometers of critical dimension loss per edge, respectively. As shown, where the tethers 221 form a part of the mirror (Plot 13a), the aperture ratio of the in-plane decoupled device 200 may be greater than the aperture ratio of either of the out-of-plane decoupled devices 220. Where the tethers do not form a part of the mirror (Plot 13b), the aperture ratio of the in-plane decoupled device 200 may be greater than the out-of-plane decoupled device 220 having a critical dimension loss of one micrometer. Moreover, in-plane decoupled device 200 having tethers 221 which do form a part of the mirror has an aperture ratio generally comparable to the out-of-plane decoupled device 220 having one micrometer of critical dimension loss and is greater than the out-of-plane decoupled device 220 having two micrometers of critical dimension loss.

The stiffener portion 216 may be configured differently in various embodiments. FIG. 18 schematically illustrates an example device 200 including a stiffener portion 216 comprising a first portion 242 positioned above and mechanically coupled to the reflective surface 208 and further comprising second and third portions 244, 246 positioned over the supports 204. For example, the second and third segments 244, 246 are positioned over stationary portion 214 of the mechanical layer 206. Such a configuration can be used to control the movement of the mechanical layer 206 and corresponding movement of the movable element 207 due to temperature excursions or variations and/or due to launch after release of the sacrificial layer. Although not shown, the device 200 of FIG. 18 may include a stop element 210 in certain embodiments. For example, the stop element 210 may come into contact with the portions 244, 246 of the stiffener portion 216 instead of the stationary portion 214 of the mechanical layer 206 when the device 200 is in an actuated state.

FIG. 19 schematically illustrates another example device 200 wherein the stiffener portion 216 is included on a device 200 comprising tethers 221 which form a part of the reflective layer 209. For example, the mechanical layer 206 comprises the same material as the reflective layer 209. The reflective layer 209 and mechanical layer 206 of the device 200 of FIG. 19 may comprise aluminum alloy having a thickness of about 300 Å in one embodiment. In one embodiment, the stiffener portion 216 includes a first segment 216a comprising $SiO_2$ and a second segment 216b comprising aluminum alloy having a thickness of about 300 Å. In another embodiment, the mechanical layer 206 and the reflective layer 209 of the device 200 of FIG. 19 comprises aluminum/nickel, and the second segment 216b of the stiffener portion 216 comprises nickel. In yet another embodiment, the mechanical layer 206 and the reflective layer 209 comprise aluminum, first segment 216a comprises a dielectric (e.g., $SiO_2$), and the second segment 216b comprises aluminum. In certain embodiments, a stiffener portion 216 may be included on devices having other device architectures besides the in-plane decoupled device architecture. For example, a stiffener portion 216 may be included on a devices having an in-plane coupled architecture, an out-of-plane decoupled architecture, or some other architecture.

In certain embodiments, the reflective layer 209 and/or reflective surface 208 and the stiffener portion 216 have different CTEs (e.g., because they are made of different materials). There can be a trade-off between maintaining one or more optical properties of the device 200, such as reflection of the reflective surface 208, and minimizing the thickness of the reflective layer 209 and/or reflective surface 208 in order to decrease the effects of the mismatch in the CTE between the stiffener portion 216 and the reflective surface 208. For example, when the reflective surface 208 comprises aluminum, the optical properties of the reflective surface 208 may begin to degrade at thicknesses under about 300 Å. In addition, the second segment 216b of the stiffener portion 216 may have a different CTE than the first segment 216a because the second segment 216b may comprise a different material (e.g., the first segment 216a may comprise silicon dioxide and the second segment 216b may comprise aluminum). For example, in certain embodiments, the CTE of the second segment 216b matches the CTE of the reflective layer 209. In some embodiments, the second segment 216b comprises the same material as the reflective layer 209, for example. The CTE balancing of the second segment 216b and the reflective layer 209 and/or the selection of the material can improve the planarity of the reflective layer 209 (e.g., by reducing bending when stresses in one or more portions of the device such as the reflective layer 209, the mechanical layer 206, the stiffener portion 216, or portions thereof, change in response to temperature). In addition, the thicknesses of one or more of the second segment 216b and the reflective surface 208 may be thin in comparison to the thickness of first segment 216a such that the forces due to mismatched materials do not substantially affect the shape of the first segment 216a, and thus advantageously do not substantially affect the shape (e.g., planarity) of the reflective layer 209 and/or reflective surface 208. In certain embodiments, the stresses applied to the top of the first segment 216a by the second segment 216b and the stresses applied to the bottom of the first segment 216a by the reflective layer 209 are substantially equal. For example, a material having a particular thickness (e.g., aluminum 300 Å thick will apply a given amount of stress). The selection of the material and/or thickness of the stiffener portion 216 or portions thereof relative can also improve the planarity of the reflective layer 209. Such improved planarity may result from a combination of the described CTE balancing and the selection of the material and/or thicknesses in certain embodiments.

In general, various components of the device 200 may comprise materials similar to those described with respect to or are otherwise similar to corresponding components of the device 100 of FIGS. 8-10. For example, in certain embodiments, one or more of the substrate 202, supports 204, mechanical layer 206, reflective layer 209, reflective surface 208, movable element 207, and stop element 210 comprise materials similar to or are otherwise similar to those described with respect to the substrate 102, supports 104, mechanical layer 106, reflective layer 109, reflective surface 108, movable element 107, and stop element 110 of the device 100.

Figure 20:
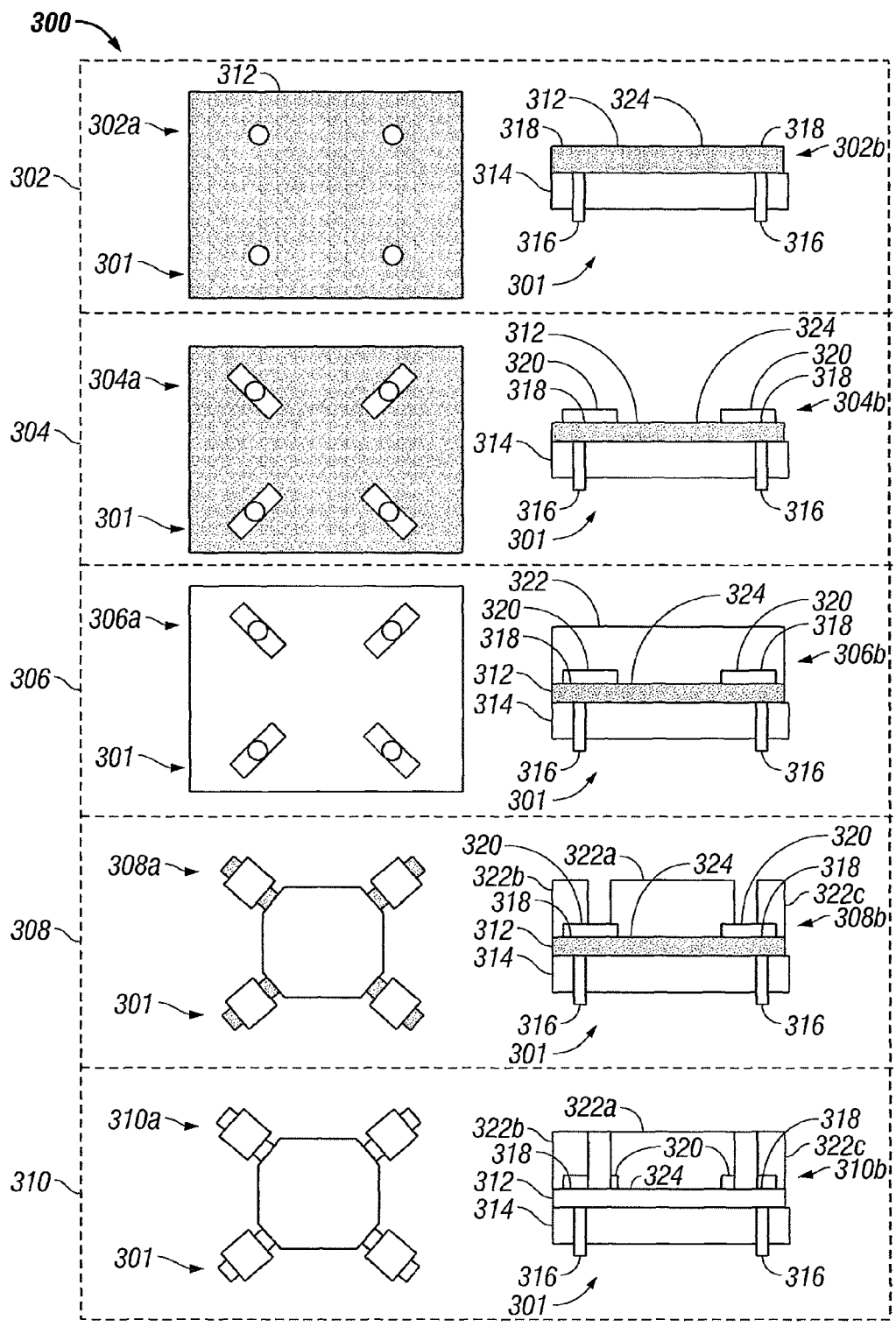
FIG. 20 schematically illustrates an example process flow for making an example device in accordance with certain embodiments described herein.

FIG. 20 schematically illustrates an example process flow 300 for making an example device 301 including a stiffener layer 322. For example, the flow 300 may be a partial process flow and one or more additional process flow blocks (not shown) may be used in addition to the illustrated process flow blocks in order to form a completed device 301. The process flow 300 is illustrated as a series of process flow blocks 302-310 each including a respective top view 302a-310a and side view 302b-310b of the device 301 at the respective process flow block. At process flow block 302, a mechanical layer 312 is deposited on a sacrificial layer 314. The mechanical layer 312 may be substantially similar to any of the mechanical layers described herein such as the mechanical layer 306 described with respect to FIGS. 13A-13B, for example. The mechanical layer 312 may comprise or be integral with a reflective surface in certain embodiments (e.g., where an in-plane coupled device architecture is employed). In other embodiments, a separate reflective surface is deposited in another process flow operation not shown (e.g., where an in-plane decoupled device architecture is employed). The reflective surface may be substantially similar to any of the reflective surfaces described herein, such as the reflective surface 208 of FIGS. 13A-13B, for example.

The device 301 includes a plurality of supports 316 over which a portion of the mechanical layer 312 is deposited. For example, the portion of the mechanical layer 312 deposited over the supports 316 may correspond to a stationary portion 318 of the mechanical layer 312. In addition, the portion of the mechanical layer 312 not over the supports 316 may correspond to a movable portion 324 of the mechanical layer 312. At process flow block 304, one or more oxide supports 320 are deposited and patterned over the mechanical layer 312. The oxide supports 320 may comprise a range of thicknesses and materials. For example, in certain embodiment, the oxide supports are between about 200 and about 5000 Å thick. In one embodiments, the oxide supports 320 are approximately 1000 Å thick. Other thicknesses and ranges of thicknesses are possible in other embodiments. In some embodiments, the oxide supports 320 comprise an oxide material (e.g., $SiO_2$ or some other oxide material). The oxide supports 320 can help control the movement of the movable portion 324 following launch (e.g., due to release after removal of the sacrificial layer). The oxide supports 320 can also help control movement of the movable portion 324 during temperature excursions or variations, thereby providing local stiffening.

At process flow block 306, a stiffener layer 322 is deposited on the device 300. The stiffener layer 322 may comprise a variety of materials. For example, in certain embodiments, the stiffener layer 322 comprises $SiO_2$, nickel, aluminum, or a combination thereof. At process flow block 308, the stiffener layer 322 is patterned. For example, the stiffener layer 322 may be patterned into three segments 322a, 322b, 322c as shown. The three segments 322a, 322b, 322c may correspond to or be generally similar in arrangement to the segments 342, 344, 346 of the device 300 of FIG. 20, for example. At process flow block 310, portions of the oxide supports 320 between the segments 322a, 322b, 322c are patterned (e.g., ashed away). The patterning of the various portions of the device 300 (e.g., the patterning of the stiffener layer 322 and/or the oxide supports 320) may allow for actuation of the completed device 300. For example, the patterning may allow for the movable portion 324 of the mechanical layer 312 and portions of the device 300 movably coupled to the movable portion 324 (e.g., the stiffener segment 322a, a reflective surface (not shown), etc.) to move with respect to the stationary portion 318 and/or other portions of the device 300 (e.g., the movable supports 316, a substrate (not shown), etc.).

One or more process flow operations may take place in addition to the process flow operations shown in process flow blocks 302-310. For example, the sacrificial layer may be removed in one or more additional process flow operations. A stop element such as the stop element 310 described herein may be formed in one or more other process flow operations. In addition, one or more of the process flow blocks 302-310 may not be included, or the order of the process flow blocks may be changed in various embodiments.

Figure 21:
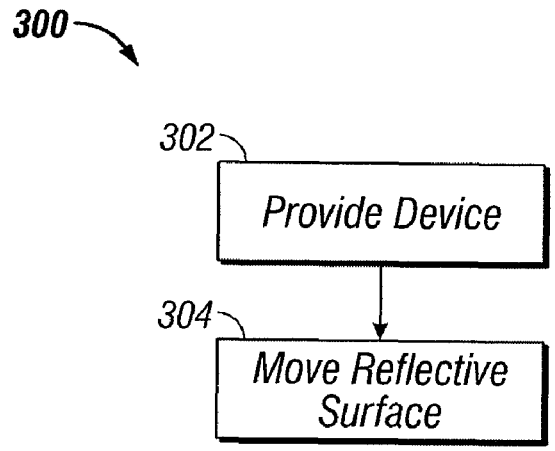
FIG. 21 is a flowchart of an example method of modulating light using a device in accordance with certain embodiments described herein.

FIG. 21 is a flowchart of an example method 400 of modulating light using a device in accordance with certain embodiments described herein. While described with respect to the device 100 (e.g., described with respect to FIGS. 8-10), the method 400 may be compatible with other devices described herein, such as the device 200 (e.g., described with respect to FIGS. 11A-13B). The method 400 comprises providing a device 100 at operational block 402. The device 100 may comprise a substrate 102, a plurality of supports 104 over the substrate 102, and a mechanical layer 106. The mechanical layer 106 may comprise a movable portion 112 and a stationary portion 114. The stationary portion 114 of certain embodiments is disposed over the supports 104. A reflective surface 108 is positioned over the substrate 102. The reflective surface 108 may be mechanically coupled to the movable portion 112. The device 100 of certain embodiments further comprises at least one movable stop element 110 displaced from and mechanically coupled to the reflective surface 108. The stop element 110 may positioned over the stationary portion 112, for example. The method 400 of certain embodiments further comprises moving the reflective surface 108 relative to the substrate 102 at operational block 404.

In certain embodiments, the method 400 further comprises applying a voltage to an actuation electrode of the device 100 which causes the device 100 to move from a relaxed state to an actuated state by moving the reflective surface 108 in a direction generally perpendicular to the substrate 102. The stop element 110 is displaced from the stationary portion 114 in the relaxed state and the stop element 110 contacts the stationary portion 114 in the actuated state.

Figure 22:
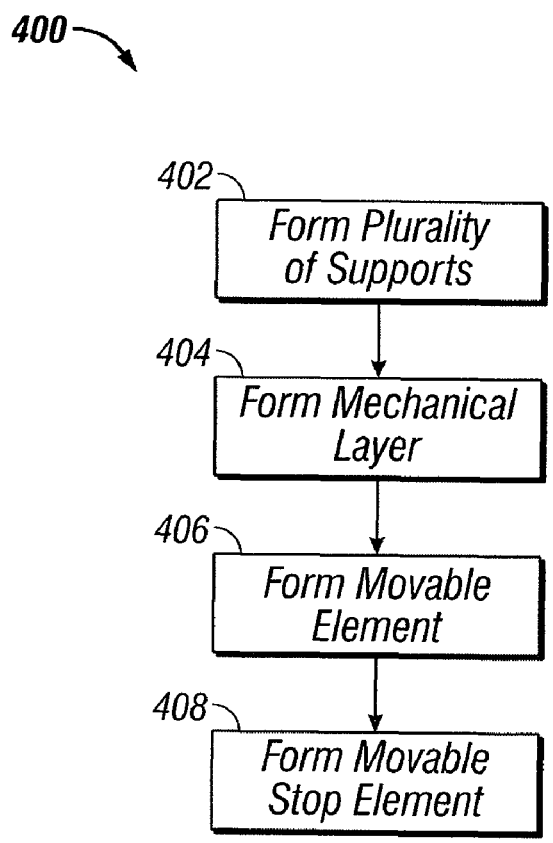
FIG. 22 is a flowchart of an example method of manufacturing a device in accordance with certain embodiments described herein.

FIG. 22 is a flowchart of an example method 400 of manufacturing a device in accordance with certain embodiments described herein. While described with respect to the device 100 (e.g., described with respect to FIGS. 8-10), the method 400 may be compatible with other devices described herein, such as the device 200 (e.g., described with respect to FIGS. 11A-13B). The method 500 of certain embodiments includes forming a plurality of supports 104 over a substrate 102 at operational block 502. The method 500 further comprises forming a mechanical layer 106 over the supports 104 at operational block 504. The mechanical layer 106 may comprise a movable portion 112 and a stationary portion 114, for example. The stationary portion 114 may be disposed over the supports 104. At operational block 506, the method 500 of certain embodiments further comprises forming a movable element over the substrate 102. The movable element may comprise a reflective surface 108 and may be mechanically coupled to the movable portion 112, for example. In certain embodiments, the method 500 includes forming at least one movable stop element 110 over the stationary portion 114 at operational block 508. The stop element 110 may be displaced from and mechanically coupled to the movable portion 112, for example.

Although certain embodiments and examples are discussed above, it is understood that the inventive subject matter extends beyond the specifically disclosed embodiments to other alternative embodiments and/or uses of the embodiments and obvious modifications and equivalents thereof. Thus, for example, in any method or process disclosed herein, the acts or operations making up the method/process may be performed in any suitable sequence and are not necessarily limited to any particular disclosed sequence. Various aspects and advantages of the embodiments have been described where appropriate. It is to be understood that not necessarily all such aspects or advantages may be achieved in accordance with any particular embodiment.

For example, in certain embodiments, devices including a stop element and/or stiffener portion in accordance with embodiments described herein may not have an in-plane decoupled device architecture. Thus, it should be recognized that the various embodiments may be carried out in a manner that achieves or optimizes one advantage or group of advantages as taught herein without necessarily achieving other aspects or advantages as may be taught or suggested herein.

What is claimed is:

1. A device comprising:
    a substrate;
    a plurality of supports over the substrate;
    a movable layer comprising a movable portion and a stationary portion, the stationary portion disposed over the supports;
    a reflective surface positioned to receive light through the substrate, the reflective surface coupled to the movable portion of the movable layer and positioned between the movable layer and the substrate; and
    at least one movable stop element coupled to the movable portion of the movable layer such that the movable layer is positioned between the stop element and the substrate, wherein at least a portion of the stop element is also positioned over the stationary portion of the movable layer such that the stop element limits movement of the movable layer when the movable layer is moved towards the substrate.

2. The device of claim 1, wherein the portion of the stop element is positioned directly over the stationary portion of the movable layer contacts the stationary portion of the movable layer when the movable layer is moved towards the substrate to limit the movement of the movable layer towards the substrate.

3. The device of claim 1, wherein the stop element is at least partially substantially laterally displaced from the reflective surface.

4. The device of claim 1, wherein the stop element is positioned over the movable portion of the movable layer.

5. The device of claim 1, wherein the device is actuatable from a relaxed state to an actuated state by moving the reflective surface in a direction generally perpendicular to the substrate.

6. The device of claim 5, wherein the stop element is displaced from the stationary portion of the movable layer when the device is in the relaxed state and contacts the stationary portion when the device is in the actuated state.

7. The device of claim 5, wherein the stop element is displaced from the plurality of supports when the device is in the relaxed state and contacts at least one of the plurality of supports when the device is in the actuated state.

8. The device of claim 5, further comprising an actuation electrode and wherein the actuation of the device occurs in response to a voltage difference applied between the actuation electrode and one or more of the movable layer and the reflective surface.

9. The device of claim 1, wherein the movable portion comprises one or more tethers extending from the stationary portion.

10. The device of claim 1, further comprising a stiffener portion positioned above and mechanically coupled to the reflective surface.

11. The device of claim 10, wherein the stiffener portion is positioned between the movable portion and the at least one stop element.

12. The device of claim 1, further comprising:
    a display;
    a processor that is configured to communicate with said display, said processor being configured to process image data; and
    a memory device that is configured to communicate with said processor.

13. The device as recited in claim 12, further comprising
a driver circuit configured to send at least one signal to said display; and
a controller configured to send at least a portion of said image data to said driver circuit.

14. The device as recited in claim 12, further comprising an image source module configured to send said image data to said processor, wherein said image source module comprises at least one of a receiver, transceiver, and transmitter.

15. The device as recited in claim 12, further comprising an input device configured to receive input data and to communicate said input data to said processor.

16. A device comprising:
means for reflecting light;
first means for supporting the reflecting means, wherein the reflecting means is positioned to receive light through the first supporting means;
second means for supporting the reflecting means over the first supporting means and for moving the reflecting means relative to the first supporting means, the second supporting means comprising a movable portion and a stationary portion, wherein the reflecting means is positioned between the second supporting means and the first supporting means; and
means for limiting movement of the second supporting means, the limiting means coupled to the movable portion of the second supporting means and positioned such that the second supporting means is positioned between the limiting means and the first supporting means, wherein at least a portion of the limiting means is also positioned over the stationary portion of the second supporting means such that the limiting means limits the movement of the second supporting means when the second supporting means is moved towards the first supporting means.

17. The device of claim 16, wherein the first supporting means comprises a substrate.

18. The device of claim 17, wherein the first supporting means further comprises a plurality of supports disposed over the substrate, and wherein the stationary portion of the second supporting means is disposed over the supports.

19. The device of claim 16, wherein the second supporting means comprises a movable layer.

20. The device of claim 16, wherein the reflecting means comprises a reflective surface.

21. The device of claim 16, wherein the limiting means comprises a stop element mechanically coupled to the reflecting means, wherein a portion of the stop element is displaced from the reflecting means.

22. A method of manufacturing a device, the method comprising:
forming a plurality of supports over a substrate;
forming a movable layer over the supports comprising a movable portion and a stationary portion, the stationary portion disposed over the supports;
forming a reflective surface coupled to the movable portion of the movable layer between the movable layer and the substrate, the reflective surface positioned to receive light through the substrate; and
forming at least one movable stop element over the stationary portion, the stop element mechanically coupled to the movable portion of the movable layer such that the stop element limits the movement of the movable layer when the movable layer is moved towards the substrate.

23. The method of claim 22, wherein the stop element is formed such that a portion of the stop element positioned directly over the stationary portion of the movable layer contacts the stationary portion of the movable layer when the movable layer is moved towards the substrate to limit the movement of the movable layer towards the substrate.

24. The method of claim 22, wherein the device is actuatable from a relaxed state to an actuated state by moving the reflective surface in a direction generally perpendicular to the substrate.

25. The method of claim 22, wherein the at least one movable stop element is formed at least partially substantially laterally displaced from the reflective surface.

26. The method of claim 22, wherein the at least one stop element is positioned over the movable portion of the movable layer.

27. The method of claim 24, wherein the at least one stop element is displaced from the stationary portion of the movable layer when the device is in the relaxed state and contacts the stationary portion of the movable layer when the device is in the actuated state.

28. The method of claim 22, wherein the at least one stop element is displaced from the plurality of supports when the device is in the relaxed state and contacts at least one of the plurality of supports when the device is in the actuated state.

29. The method of claim 22, further comprising forming an actuation electrode, and wherein the actuation of the device occurs in response to a voltage difference applied between the actuation electrode and one or more of the movable layer and the reflective surface.

30. The method of claim 22, wherein the movable portion of the movable layer includes one or more tethers extending from the stationary portion.

31. The method of claim 22, further comprising forming a stiffener portion above and mechanically coupled to the reflective surface.

* * * * *

UNITED STATES PATENT AND TRADEMARK OFFICE
CERTIFICATE OF CORRECTION

PATENT NO. : 8,270,062 B2  Page 1 of 1
APPLICATION NO. : 12/562093
DATED : September 18, 2012
INVENTOR(S) : Kothari et al.

It is certified that error appears in the above-identified patent and that said Letters Patent is hereby corrected as shown below:

Title page 4, item 56 at line 71, Under Other Publications, change "Liquivista" to --Liquavista--.

Title page 4, item 56 at line 9, Under Other Publications, change "IEEEE" to --IEEE--.

Title page 4, item 56 at line 40, Under Other Publications, change "MEM" to --MEMS--.

Sheet 20 of 22 (FIG. 19) at line 6 (approx.), Change "2204" to --204--.

In column 8 at line 8, Change "respectively" to --respectively.--.

In column 32 at line 25, In Claim 2, after "element" delete "is".

Signed and Sealed this
Twenty-sixth Day of February, 2013

Teresa Stanek Rea
*Acting Director of the United States Patent and Trademark Office*